US009739543B2

(12) United States Patent
Yi et al.

(10) Patent No.: US 9,739,543 B2
(45) Date of Patent: Aug. 22, 2017

(54) HEAT SINK

(71) Applicant: Tyco Electronics Corporation, Berwyn, PA (US)

(72) Inventors: Chong Hun Yi, Mechanicsburg, PA (US); Andrew Dewitt Balthaser, Dauphin, PA (US); Brian Klinger, Harrisburg, PA (US); Matt Richard McAlonis, Elizabethtown, PA (US); Keith Miller, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 698 days.

(21) Appl. No.: 13/760,706

(22) Filed: Feb. 6, 2013

(65) Prior Publication Data

US 2014/0216703 A1    Aug. 7, 2014

(51) Int. Cl.
| | | |
|---|---|---|
| *F28F 3/02* | (2006.01) | |
| *H01L 23/367* | (2006.01) | |
| *H01L 23/373* | (2006.01) | |
| *H01L 23/40* | (2006.01) | |
| *H01L 23/427* | (2006.01) | |

(52) U.S. Cl.
CPC .............. *F28F 3/02* (2013.01); *H01L 23/367* (2013.01); *H01L 23/373* (2013.01); *H01L 23/40* (2013.01); *H01L 23/427* (2013.01); *H01L 2924/0002* (2013.01)

(58) Field of Classification Search
CPC . H01L 23/40; H01L 23/4006; H01L 23/4012; H01L 23/4093
USPC .............. 165/80.3, 185, 134.1; 361/704, 710
See application file for complete search history.

(56) References Cited

U.S. PATENT DOCUMENTS

| | | | | |
|---|---|---|---|---|
| 5,329,426 | A | * 7/1994 | Villani | ................. H01L 23/4093 24/625 |
| 5,964,285 | A | * 10/1999 | Huang | ................. H01L 23/3672 165/185 |
| 6,061,235 | A | 5/2000 | Cromwell et al. | |
| 6,263,956 | B1 | * 7/2001 | Tang | ................... H01L 23/3672 165/80.3 |
| 6,357,514 | B1 | * 3/2002 | Sasaki | ................. H01L 23/3672 165/185 |

(Continued)

FOREIGN PATENT DOCUMENTS

| | | |
|---|---|---|
| DE | 10 2006 019 376 A1 | 10/2007 |
| JP | 10-092985 A | 4/1998 |

OTHER PUBLICATIONS

International Search Report, International Application No. PCT/US2014/014077, International Filing Date, Jan. 31, 2014.

*Primary Examiner* — Jianying Atkisson
*Assistant Examiner* — For K Ling

(57) ABSTRACT

A heat sink includes a frame having a non-metallic body that includes a window. The non-metallic body includes at least one peripheral wall that defines a boundary of the window. The non-metallic body includes a non-metallic material. The heat sink also includes a heat exchanger having a base and cooling fins. The base has a structure side and an opposite environmental side. The structure side of the base is configured to thermally communicate with a structure for absorbing heat from the structure. The cooling fins extend from the environmental side of the base. The heat exchanger is held by the frame such that the cooling fins extend within the window of the frame.

20 Claims, 11 Drawing Sheets

(56) References Cited

U.S. PATENT DOCUMENTS

| | | | |
|---|---|---|---|
| 8,274,793 B2* | 9/2012 | Wang | H01L 23/4093 |
| | | | 165/121 |
| 2002/0024796 A1 | 2/2002 | Shih | |
| 2003/0178181 A1 | 9/2003 | Noda et al. | |
| 2004/0188080 A1* | 9/2004 | Gailus | F28F 13/00 |
| | | | 165/185 |
| 2008/0068805 A1 | 3/2008 | Xu et al. | |
| 2011/0030940 A1* | 2/2011 | Takeda | H01L 23/373 |
| | | | 165/185 |
| 2013/0027889 A1* | 1/2013 | Macall | H01L 23/4006 |
| | | | 361/720 |

\* cited by examiner

HEAT SINK

BACKGROUND OF THE INVENTION

The subject matter described and/or illustrated herein relates generally to heat sinks The performance of many electrical components may be dependent upon the temperature at which the electrical component operates. Specifically, many electrical components generate heat during operation. The heat can build up to an extent that the operating temperature of an electrical component negatively affects the performance of the electrical component. For example, the speed at which a processor processes signals may be reduced when the processor operates at higher operating temperatures. Higher operating temperatures may also decrease the operational life of an electrical component. Accordingly, it may be desirable to cool an electrical component during operation thereof.

Heat sinks are often used to cool electrical components. A heat sink may include a base and one or more cooling fins that extend outward from the base. The base is mounted in thermal communication with the electrical component for absorbing heat from the electrical component. The cooling fins dissipate heat from the base to the ambient environment. But, known heat sinks are not without disadvantages. For example, at least some known heat sinks are fabricated using aluminum or copper, which may add weight to the heat sink and/or may be relatively difficult to manufacture (e.g., may be difficult to machine). Accordingly, at least some known heat sinks are relatively heavy and/or relatively costly to manufacture.

BRIEF DESCRIPTION OF THE INVENTION

In one embodiment, a heat sink includes a frame having a non-metallic body that includes a window. The non-metallic body includes at least one peripheral wall that defines a boundary of the window. The non-metallic body includes a non-metallic material. The heat sink also includes a heat exchanger having a base and cooling fins. The base has a structure side and an opposite environmental side. The structure side of the base is configured to thermally communicate with a structure for absorbing heat from the structure. The cooling fins extend from the environmental side of the base. The heat exchanger is held by the frame such that the cooling fins extend within the window of the frame.

In another embodiment, a heat sink includes a heat exchanger having a base and cooling fins. The base has a structure side and an opposite environmental side. The cooling fins extend from the environmental side of the base. The heat sink also includes a base frame having a non-metallic material, and a base plate holding the base frame such that at least a portion of the base frame is sandwiched between the base plate and the structure side of the base of the heat exchanger. The base plate is connected in thermal communication with the structure side of the base of the heat exchanger. The base plate includes carbon graphite. The structure side of the base of the heat exchanger is configured to thermally communicate with a structure through the base plate for absorbing heat from the structure.

In another embodiment, a heat sink includes a frame having a non-metallic body that includes insert pockets. At least a majority of the non-metallic body is fabricated from a non-metallic material. The heat sink also includes heat exchanger inserts that are held within corresponding insert pockets of the non-metallic body. Each heat exchanger insert includes a base and cooling fins. The base has a structure side and an opposite environmental side. The cooling fins extend from the environmental side of the base. At least a segment of the structure side is exposed within the corresponding insert pocket such that the structure side is configured to thermally communicate with a structure for absorbing heat from the structure.

DETAILED DESCRIPTION OF THE INVENTION

Figure 1:
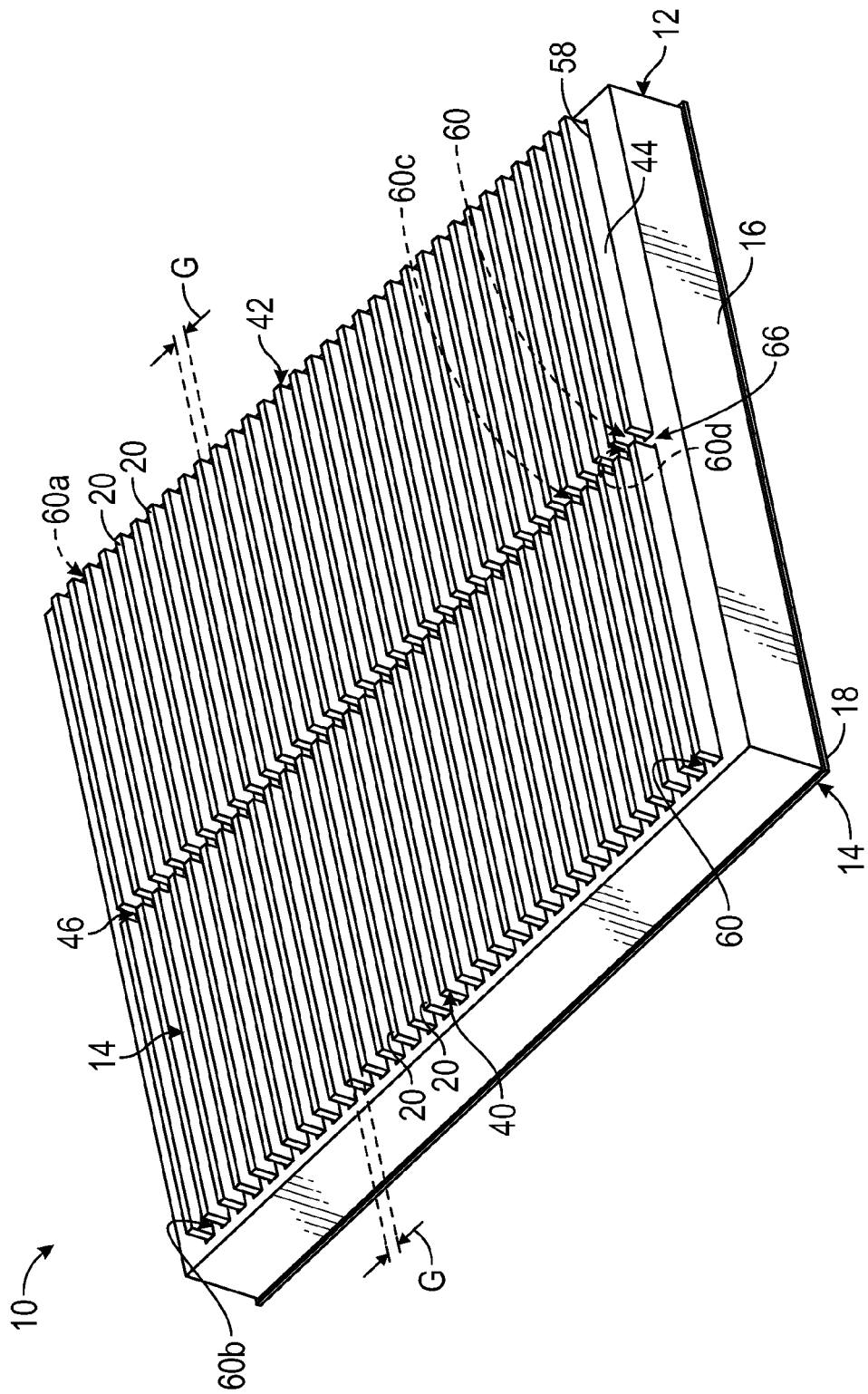
FIG. 1 is a perspective view of an exemplary embodiment of a heat sink.

FIG. 1 is a perspective view of an exemplary embodiment of a heat sink 10. The heat sink 10 includes a frame 12 and a heat exchanger 14 held by the frame 12. As will be described in more detail below, the frame 12 has a non-metallic body 16 that includes one or more non-metallic materials. The non-metallic material(s) of the non-metallic body 16 may facilitate reducing a weight of the heat sink 10, as will also be described below.

Figure 2:
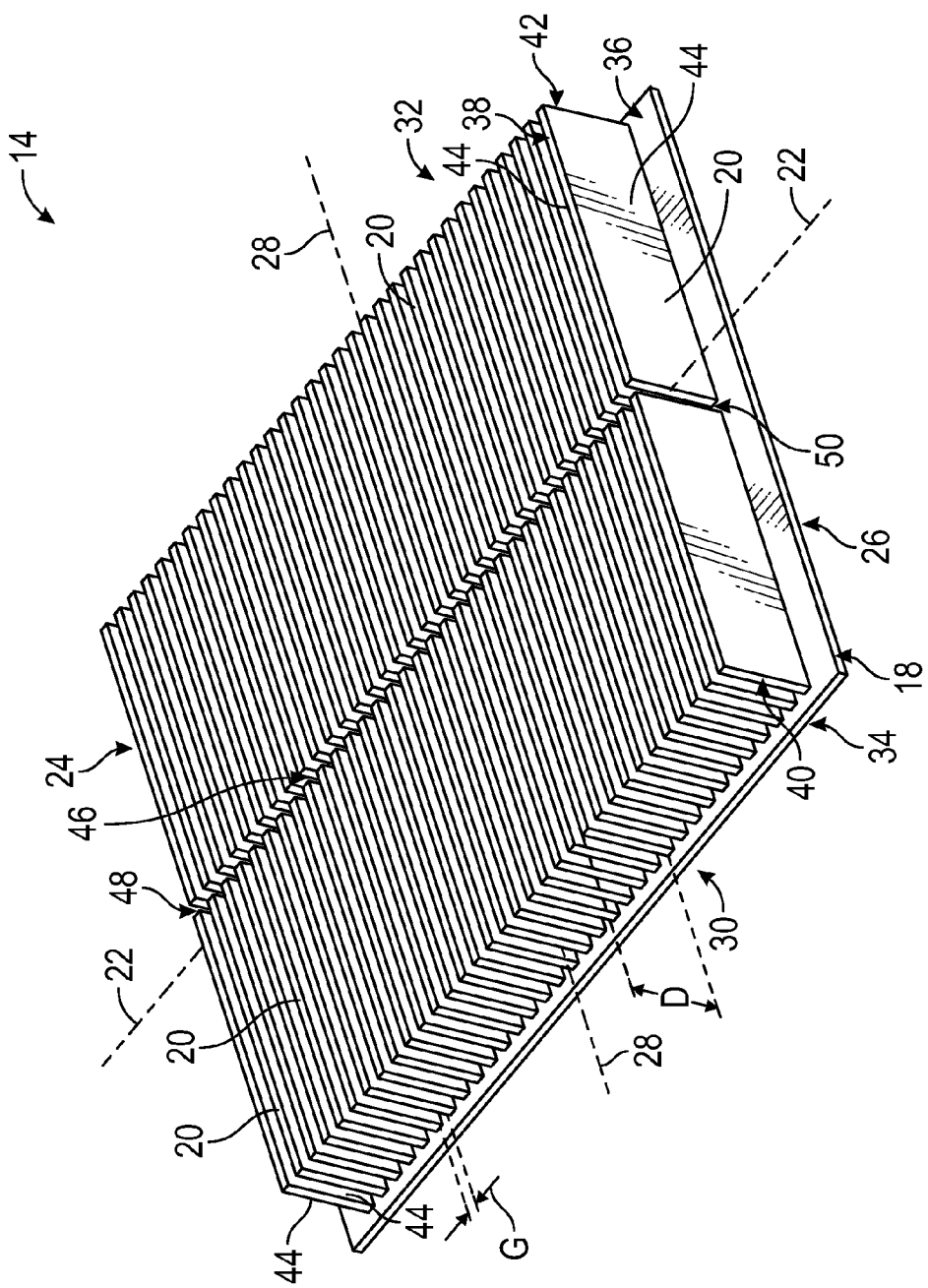
FIG. 2 is a perspective view of an exemplary embodiment of a heat exchanger of the heat sink shown in FIG. 1.

FIG. 2 is a perspective view of an exemplary embodiment of the heat exchanger 14. The heat exchanger 14 includes a base 18 and a plurality of cooling fins 20 that extend outward from the base 18. In the exemplary embodiment of the heat exchanger 14, the heat exchanger 14 has the general shape of a rectangle and extends a length along a central longitudinal axis 22 from an end 24 to an end 26 that is opposite the end 24. The heat exchanger 14 extends a width along a central latitudinal axis 28 from a side end 30 to an opposite side end 32 in the exemplary embodiment. But, the heat exchanger 14 is not limited to the rectangular shape shown herein. Rather, the heat exchanger 14 may additionally or alternatively include any other shape, such as, but not limited to, another rectangular shape (e.g., a square shape), a circular shape, an oval shape, shape having more than four sides, an irregular shape, and/or the like.

The heat exchanger 14 includes the base 18, which extends from the end 24 to the end 26, and from the side end 30 to the side end 32. The base 18 includes a structure side 34 and an opposite environmental side 36. The structure side 34 of the base 18 is configured to be connected in thermal communication with a structure (e.g., an electrical component, which is not shown) for absorbing heat from the structure. The structure side 34 of the base 18 may be connected in thermal communication with the structure in any manner that enables the base 18 to absorb heat from the structure. For example, the structure side 34 of the base 18 may be engaged in physical contact with the structure to directly connect the base 18 and the structure in thermal communication, and/or a thermal interface material (not shown) may extend between the structure side 34 of the base 18 and the structure to indirectly connect the base 18 and the structure in thermal communication. During operation of the heat sink 10, the base 18 absorbs heat from the structure and the cooling fins 20 that extend along the environmental side 36 dissipate the absorbed heat to the ambient environment via convection.

In the exemplary embodiment of the heat exchanger 14, the structure side 34 of the base 18 is approximately planar. But, the structure side 34 of the base 18 is not limited to being approximately planar. Rather, the structure side 34 of the base 18 may additionally or alternatively include a wide variety of other shapes, textures, surfaces, and/or the like. The structure is not limited to being an electrical component, but rather the heat exchanger 14 may be used with any structure from which it is desired to dissipate heat.

The cooling fins 20 extend outward from the environmental side 36 of the base 18. Each cooling fin 20 extends a height outward from the environmental side 36 of the base 18 to a tip 38 of the cooling fin 20. Each cooling fin 20 extends a length along the base 18 from an end 40 to an opposite end 42. The cooling fins 20 include opposite sidewalls 44 that extend along the height and length of the cooling fins 20. The heat exchanger 14 may include any number of the cooling fins 20.

As can be seen in FIG. 2, the cooling fins 20 are arranged side-by-side along the environmental side 36 of the base 18 such that the cooling fins 20 are spaced apart from each other. Specifically, adjacent cooling fins 20 are spaced apart from each other by a gap G along the environmental side 36 of the base 18. In the exemplary embodiment of the heat exchanger 14, the lengths of the cooling fins 20 extend approximately parallel to the central latitudinal axis 28 of the heat exchanger 14. Alternatively, the lengths of the cooling fins 20 extend approximately parallel to the central longitudinal axis 22 of the heat exchanger 14 or extend at an oblique angle relative to both the axes 22 and 28 of the heat exchanger 14. Moreover, in the exemplary embodiment of the heat exchanger 14, the lengths of the cooling fins 20 extend along a majority of the width of the base 18. In some embodiments, the length of one or more of the cooling fins 20 extends along an approximate entirety or less than a majority of the width of the base 18. Further, the exemplary embodiment of the cooling fins 20 are positioned along a majority of the length of the heat exchanger 14. But, the heat exchanger 14 may have cooling fins 20 positioned along an approximate entirety of the length of the heat exchanger 14 or may have cooling fins 20 positioned along less than a majority of the length of the heat exchanger 14.

Accordingly, the heat exchanger 14 is not limited to the pattern of the cooling fins 20 shown herein. Rather, the pattern of the cooling fins 20 shown herein is meant as exemplary only. Examples of other patterns of the cooling fins 20 include, but are not limited to, patterns wherein at least one cooling fin 20 has a different height relative to at least one other cooling fin 20, patterns wherein at least one cooling fin 20 has a different length relative to at least one other cooling fin 20, patterns wherein the lengths of the cooling fins 20 have the same orientation as each other but a different orientation relative to the base 18 than is shown and/or described herein, patterns wherein at least one cooling fin 20 has a different orientation relative to the base 18 as compared to at least one other cooling fin 20, patterns wherein at least one cooling fin 20 has a different location along the environmental side 36 of the base 18 relative to at least one other cooling fin 20 (whether or not the lengths of any cooling fins 20 overlap), and/or the like.

Optionally, the heat exchanger 14 includes a slot 46 that is configured to receive a bridge 66 (FIGS. 1 and 3) of the frame 12, as will be described below. The slot 46 extends through the cooling fins 20 across the lengths of the cooling fins 20. In other words, the length of the slot 46 extends along the length of the heat exchanger 14. The slot 46 extends the length from an end 48 of the slot 46 to an opposite end 50 of the slot 46. In the exemplary embodiment of the heat exchanger 14, the length of the slot 46 extends approximately parallel to the central longitudinal axis 22 of the heat exchanger 14. But, the length of the slot 46 may alternatively extend at an oblique angle relative to the central longitudinal axis 22. Moreover, the exemplary embodiment of the slot 46 extends at an approximate midpoint of the width of the heat exchanger 14, as can be seen in FIG. 2. Alternatively, the slot 46 extends at another location that is between the side ends 30 and 32.

The slot 46 extends a depth D into the heat exchanger 14. The slot 46 may have any depth D. In the exemplary embodiment of the heat exchanger 14, the depth D of the slot 46 is approximately equal to the height of the cooling fins 20 such that the slot 46 extends completely through the height of the cooling fins 20 to the environmental side 36 of the base 12. But, the depth D of the slot 46 may be less than the height of the cooling fins 20 such that the slot 46 extends only partially through the height of the cooling fins 20. Moreover, the depth D of the slot 46 may be greater than the height of the cooling fins 20 such that the slot 46 extends at least partially through the base 18.

The heat exchanger 14 may include any materials, such as, but not limited to, aluminum, copper, another metal, and/or the like. In some embodiments, the heat exchanger 14 includes an aluminum alloy, a copper alloy, another metal alloy, and/or the like. Moreover, in some embodiments, a majority or an approximate entirety of the heat exchanger is fabricated from a single material and/or material alloy. In the exemplary embodiment of the heat exchanger 14, an approximate entirety of the heat exchanger 14 is fabricated from aluminum (and/or an aluminum alloy), copper (and/or a copper alloy), and/or another metal (and/or another metal alloy). One example of fabricating less than an approximate entirety of the heat exchanger 14 from a single material and/or material alloy includes providing the heat exchanger 14 with a base material and/or material alloy that is coated (e.g., plated) with one or more different materials and/or material alloys.

Figure 3:
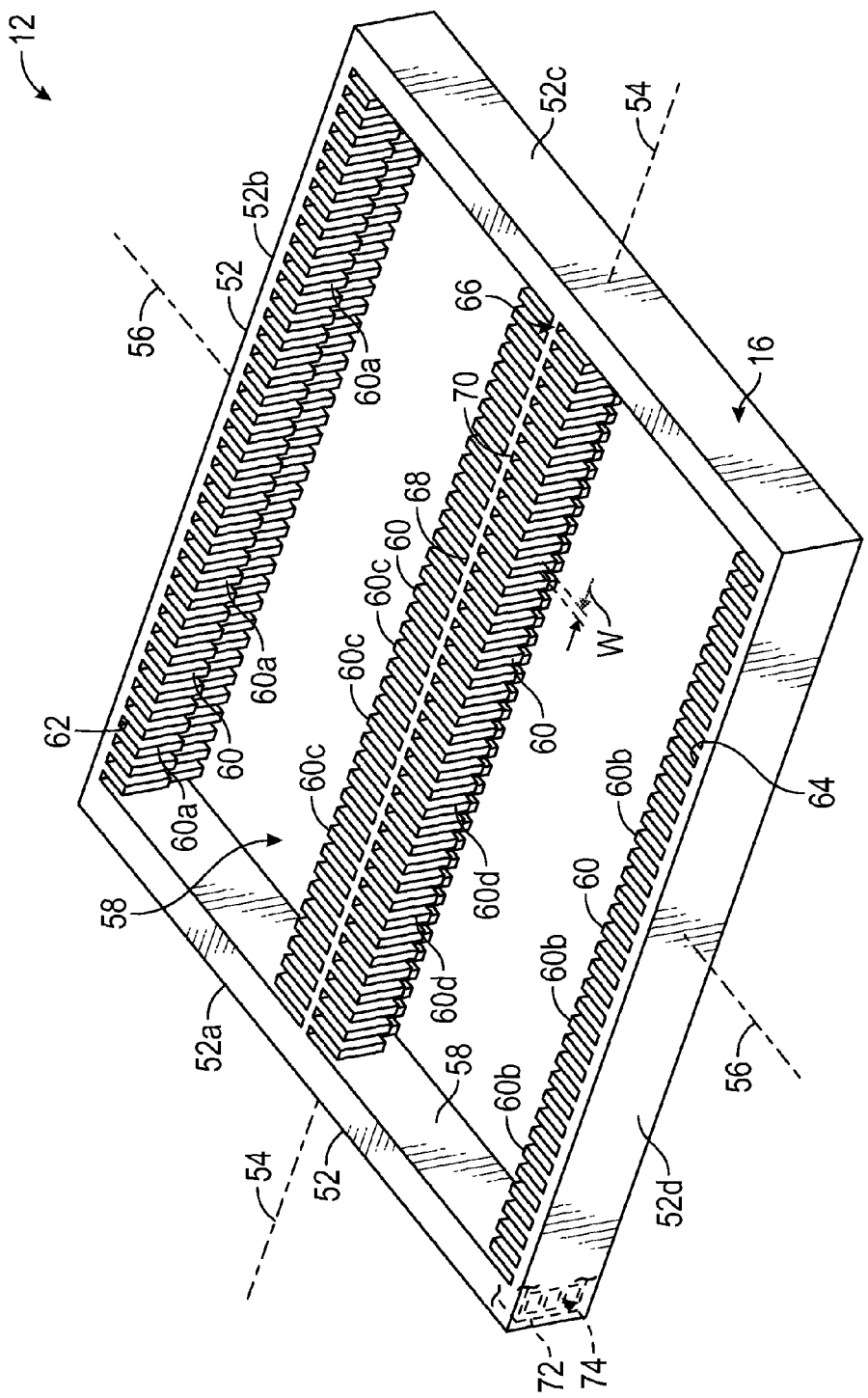
FIG. 3 is a perspective view of an exemplary embodiment of a frame of the heat sink shown in FIG. 1.

FIG. 3 is a perspective view of an exemplary embodiment of the frame 12 of the heat sink 10. The frame 12 includes the non-metallic body 16, which includes one or more peripheral walls 52. In the exemplary embodiment of the frame 12, the non-metallic body 16 has the general shape of a rectangle, such that the non-metallic body 16 includes four peripheral walls 52a, 52b, 52c, and 52d. But, the non-metallic body 16 of the frame 12 is not limited to the rectangular shape shown herein. Rather, the non-metallic body 16 of the frame 12 may additionally or alternatively include any other shape, such as, but not limited to, another rectangular shape (e.g., a square shape), a circular shape, an oval shape, shape having more than four sides, an irregular shape, and/or the like. The non-metallic body 16 of the frame 12 may include any number of the peripheral walls 52. It should be understood that the number of peripheral walls 52 of the non-metallic body 16 will depend on the shape of the non-metallic body 16.

In the exemplary embodiment of the frame 12, the non-metallic body 16 extends a length along a central longitudinal axis 54 and extends a width along a central latitudinal axis 56. The non-metallic body 16 includes a window 58 that extends through the non-metallic body 16, as is shown in FIG. 3. The peripheral walls 52a-52d define the boundary of the window 58. The window 58 is configured to receive the heat exchanger 14 (FIGS. 1, 2, and 4) therein. In the exemplary embodiment of the window 58, the window 58 has the general shape of a rectangle. But, the window 58 may have any shape that enables the window 58 to receive the heat exchanger 14 therein, whether or not the window 58 has the same general shape as the heat exchanger 14. Accordingly, the window 58 is not limited to the rectangular shape shown herein, but rather may additionally or alternatively include any other shape, such as, but not limited to, another rectangular shape (e.g., a square shape), a circular shape, an oval shape, shape having more than four sides, an irregular shape, and/or the like. Although shown as having the same general rectangular shape as the non-metallic body 16, alternatively the window 58 includes a different shape than the non-metallic body 16.

Figure 4:
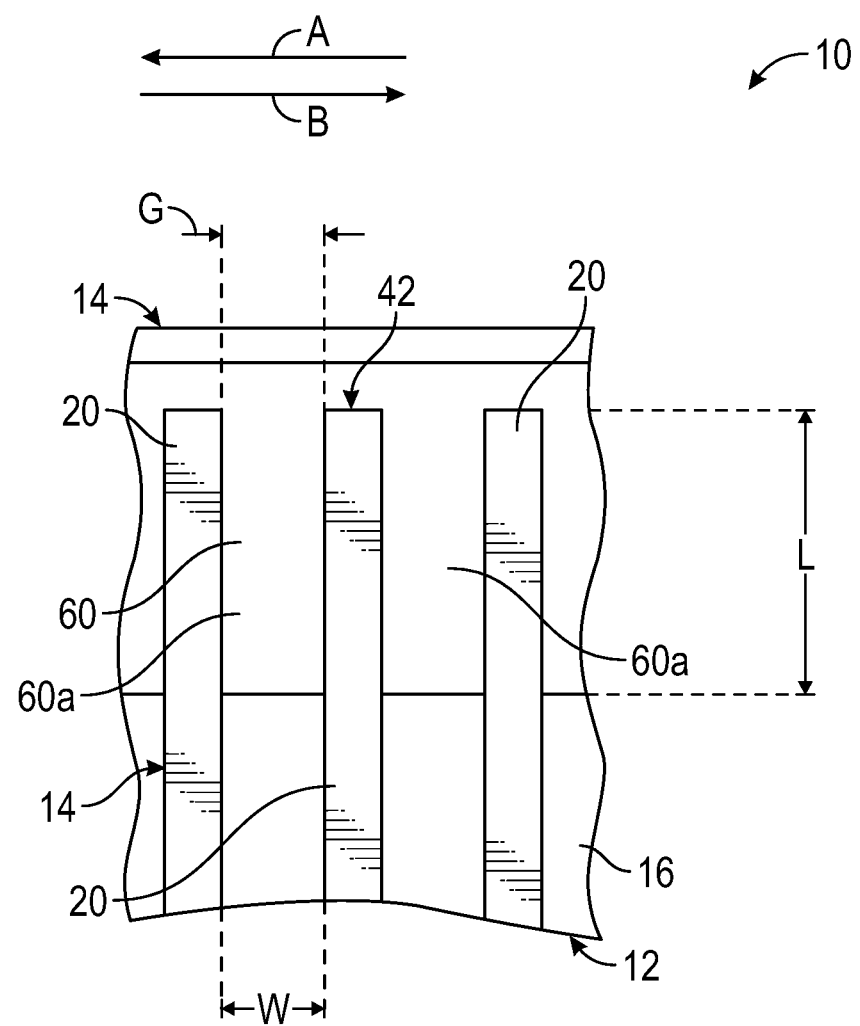
FIG. 4 is a plan view of a portion of the heat sink shown in FIG. 1.

The non-metallic body 16 of the frame 12 may include support fingers 60 for supporting the cooling fins 20 (FIGS. 1, 2, and 4). The support fingers 60 may facilitate reducing the thickness and/or increasing the height of the cooling fins 20, as will be described below. In the exemplary embodiment of the frame 12, the non-metallic body 16 includes a plurality of support fingers 60a that extend into the window 58 from an interior surface 62 of the peripheral wall 52b. The non-metallic body 16 optionally includes a plurality of support fingers 60b that extend into the window 58 from an interior surface 64 of the peripheral wall 52d. Each support finger 60a and 60b is configured to be received within the gap G (FIGS. 1, 2, and 4) between a corresponding pair of adjacent cooling fins 20 for supporting the cooling fins 20. Specifically, each support finger 60a is configured to extend into the gap G between the corresponding pair of adjacent cooling fins 20 at the ends 42 (FIGS. 1, 2, and 4) of the cooling fins 20. Each support finger 60b is configured to extend into the gap G between the corresponding pair of adjacent cooling fins 20 at the other ends 40 (FIGS. 1 and 2) of the cooling fins 20.

Optionally, the non-metallic body 16 of the frame 12 includes a bridge 66 that extends a length across the window 58. The bridge 66 is configured to be received within the slot 46 (FIGS. 1 and 2) of the heat exchanger 14, as will be described below. The bridge 66 extends the length from the peripheral wall 52a to the peripheral wall 52c. In the exemplary embodiment of the frame 12, the length of the bride 66 extends approximately parallel to the central longitudinal axis 54 of the non-metallic body 16. But, the length of the bridge 66 may alternatively extend at an oblique angle relative to the central longitudinal axis 54. Moreover, the exemplary embodiment of the bridge 66 extends at an approximate midpoint of the width of the non-metallic body 16, as can be seen in FIG. 3. Alternatively, the bridge 66 extends at another location along the width of the non-metallic body 16.

The bridge 66 includes opposite surfaces 68 and 70 and opposite sets of support fingers 60c and 60d that extend outwardly from the surfaces 68 and 70, respectively, in opposite directions. Specifically, the support fingers 60c extend outward from the surface 68 of the bridge 66 toward the peripheral wall 52b. The support fingers 60d extend outward from the surface 70 of the bridge 66 toward the peripheral wall 52d. Each support finger 60c and 60d is configured to be received within the gap G between a corresponding pair of adjacent cooling fins 20 for supporting the cooling fins 20. Specifically, the support fingers 60c and 60d are configured to extend into the gaps G between corresponding pairs of adjacent cooling fins 20 on opposing sides of where the slot 46 intersects the cooling fins 20.

Each support finger 60 may have any size and any shape that enables the support finger 60 to function as described and/or illustrated herein. In some embodiments, one or more of the support fingers 60 has a width W that is substantially equal to, or slightly larger than, the gap G between the corresponding pair of adjacent cooling fins 20. Although shown as having the general shape of a parallelepiped, each support finger 60 may additionally or alternatively include any other shape.

As described above, the non-metallic body 16 of the frame 12 includes one or more non-metallic materials. The non-metallic body 16 may include any non-metallic material and may include any number of different non-metallic materials. In some embodiments, a majority or an approximate entirety of the non-metallic body 16 is fabricated from one or more non-metallic materials. In some embodiments, the non-metallic body 16 does not include a metal. One example of fabricating less than an approximate entirety of the non-metallic body 16 from one or more non-metallic materials includes providing the non-metallic body 16 with one or more non-metallic base materials that is coated with one or more metallic materials. The non-metallic body 16 may or may not include a hollow interior space that is filled with a polymer, air, another gas, a vacuum, and/or the like. For example, in the exemplary embodiment of the non-metallic body 16, the non-metallic body 16 includes a shell 72 that is fabricated from one or more non-metallic materials. The shell 72 is at least partially filled with one or more polymers 74, such as, but not limited to, a plastic, a thermoplastic, a foam, an expanded material, polyphenylene sulfide (PPS), and/or the like. The shell 72 may have any thickness and may be filled with any amount of the polymer 74. In some alternative embodiments, the non-metallic body 16 does not include a hollow interior space.

The non-metallic material(s) of the non-metallic body 16 may each be any type of non-metallic material, such as, but not limited to, a composite material, a plastic, and/or the like. Examples of composite materials that the non-metallic body 16 may be fabricated from include, but are not limited to, a fiber-reinforced composite material, a fiber-reinforced polymer (FRP), a thermoplastic composite, a short fiber thermoplastic, a long fiber thermoplastic, a continuous fiber thermoplastic, a thermoset composite, a shape memory polymer composite, a metal matrix composite (MMC), a ceramic matrix composite, cermet, an organic matrix/ceramic aggregate composite, a wood plastic composite, an engineered wood, and/or the like. Any composite material(s) of the non-metallic body 16 may include a reinforcement material and a matrix material. Examples of reinforcement materials that may be used to fabricate the non-metallic body 16 include, but are not limited to, carbon fibers, a short fiber reinforcement material, a long fiber reinforcement material, a continuous fiber reinforcement material, glass fibers, metal fibers, a metal powder, aramid fibers, para-aramid fibers, meta-aramid fibers, a ceramic, and/or the like. The reinforcement materials may be arranged in any orientation and/or pattern, such as, but not limited to, a random pattern, a woven pattern, and/or the like. Examples of matrix materials that may be used to fabricate the non-metallic body 16 include, but are not limited to, polyester, vinyl ester, epoxy, phenolic, polyimide, polyamide, polypropylene, polyether ether ketone (PEEK), a shape memory polymer, a ceramic, and/or the like.

Examples of plastics that the non-metallic body 16 may be fabricated from include, but are not limited to, a thermoplastic, a thermosetting polymer, an acrylic, a polyester, a silicone, a polyurethane (PU), a halogenated plastic, a condensation plastic, a polyaddition plastic, a cross-linked plastic, a polyethylene (PE), low-density PE (LDPE), high-density PE, a polypropylene (PP), a polyamide (i.e., nylon), a polystyrene (PS), high impact PS, polyvinyl chloride (PVC), polytetrafluoroethylene (PTFE), polyvinylidene chloride (PVDC), polyethylene terephthalate (PET), acrylonitrile butadiene styrene (ABS), PE/ABS, polycarbonate (PC), PC/ABS, polymethyl methacrylate (PMMA), urea-formaldehyde (UF), melamine formaldehyde (MF), a plastarch material, a phenolic (PF; also referred to as phenol formaldehydes), polyetheretherketone (PEEK), polyetherimide (PEI), polylactic acid (PLA), an elastomeric plastic, a synthetic plastic, a natural plastic, a bioplastic, a biodegradable plastic, a semi-crystalline plastic, a semi-amorphous plastic, a completely amorphous plastic, a natural rubber, a synthetic rubber, and/or the like.

Various parameters may be selected to reduce the weight of the heat sink 10 as compared to at least some known heat sinks Examples of such various parameters include, but are not limited to, the particular non-metallic material(s), the particular polymer(s), the amount of the non-metallic body 16 that is fabricated from the non-metallic material(s), the amount of the non-metallic body 16 that is fabricated from the polymer(s), and/or the like.

Referring again to FIG. 1, the heat exchanger 14 is held by the frame 12. Specifically, the heat exchanger 14 is received within the window 58 of the non-metallic body 16 of the frame 12 such that the non-metallic body 16 rests on the base 18 of the heat exchanger 14. As can be seen in FIG. 1, the cooling fins 20 extend within the window 58 of the frame 12 when the heat exchanger 14 is held by the frame 12. The heat exchanger 14 may be held within the window 58 using any type of connection, such as, but not limited to, an interference fit, a snap fit, using one or more threaded and/or other type fastener, bonding and/or sealing the heat exchanger 14 to the frame 12 (i.e., using an adhesive, an epoxy, and/or the like to mechanically and/or chemically bond the heat exchanger 14 to the frame 12), and/or the like. In some embodiments, the non-metallic body 16 simply rests on the base 18 without being otherwise connected to the heat exchanger 14. In the exemplary embodiment of the heat sink 10, the heat exchanger 14 and the non-metallic body 16 are held together using an interference fit provided by the reception of the support fingers 60 between adjacent cooling fins 20, which is described below.

When the heat exchanger 14 is held within the window 58 of the frame as shown in FIG. 1, the bridge 66 of the frame 12 is received within the slot 46 of the heat exchanger 14. The support fingers 60a are received into the gaps G between corresponding pairs of adjacent cooling fins 20 at the ends 42 of the cooling fins 20. The support fingers 60b are received into the gaps G between corresponding pairs of adjacent cooling fins 20 at the ends 40 of the cooling fins 20. The support fingers 60c and 60d of the bridge 66 extend into the gaps G between corresponding pairs of adjacent cooling fins 20 on opposing sides of where the slot 46 intersects the cooling fins 20, as can be seen in FIG. 1.

The support fingers 60 support the cooling fins 20 by providing a lateral support structure between cooling fins 20. Specifically, FIG. 4 is a plan view of a portion of the heat sink 10 illustrating the reception of a support finger 60 within the gap G between a corresponding pair of adjacent cooling fins 20. The particular support fingers 60 illustrated in FIG. 4 are the support fingers 60a. But, it should be understood that the discussion and illustration of the support fingers 60a of FIG. 4 are also applicable to the support fingers 60b, 60c, and 60d (FIGS. 1, 3, and 4).

Each support finger 60a is received into the gap G between the corresponding pair of adjacent cooling fins 20 at the ends 42 of the cooling fins 20. The support fingers 60a provide a lateral support structure that supports the cooling fins 20 laterally (i.e., along the directions of the arrows A and B in FIG. 4) via engagement with the cooling fins 20. In the exemplary embodiment of the heat sink 10, the width W of the support fingers 60a is substantially equal to, or slightly larger than, the gap G between the corresponding pair of adjacent cooling fins 20, for example to provide the interference fit between the heat exchanger 14 and the non-metallic body 16 of the frame 12 and/or to provide a predetermined amount of lateral support to the cooling fins 20. But, the width W of the support fingers 60a may have any value relative to the gap G between the corresponding pair of adjacent cooling fins 20 that enables the support fingers 60a to laterally support the cooling fins 20. Moreover, each support finger 60a may extend any length L into the gap G that enables the support fingers 60a to laterally support the corresponding adjacent pair of cooling fins 20.

The size (e.g., the height, length L, width W, and/or the), shape, and/or the like of the support fingers 60a may be selected such that the support fingers 60a provide a predetermined amount of lateral support to the cooling fins 20. The support fingers 60a may facilitate reducing the thickness and/or increasing the height of the cooling fins 20. For example, the lateral support provided by the support fingers 60a may enable the cooling fins 20 to be taller and/or thinner without fracturing, collapsing, and/or otherwise failing. The reduced thickness of the cooling fins 20 increases the surface area of the base 18 that is exposed between adjacent cooling fins 20, while the reduced height of the cooling fins 20 increases the surface area of the side walls 44 of the cooling fins 20.

Referring again to FIG. 1, various parameters may be selected to provide the heat sink 10 with a predetermined weight, provide the heat sink 10 with a predetermined thermal performance, and/or to balance the weight relative to the thermal performance of the heat sink 10. Examples of such various parameters include, but are not limited to, the non-metallic material(s) (and the material(s) of the polymer 74 if included) of the non-metallic body 16, the geometry and/or structure of the non-metallic body 16, the material(s) of the heat exchanger 14, the geometry and/or structure of the heat exchanger 14 (e.g., of the cooling fins 20, the base 18, and/or the like), and/or the like. As used herein, the term "thermal performance" is intended to mean the amount of heat a heat sink can dissipate over a given amount of time.

The heat sink 10 may have a reduced weight as compared to at least some known heat sinks. For example, the non-metallic material(s) (and the polymer 74, if included) of the frame 12 have less weight than the aluminum and/or copper materials used in at least some known heat sinks. Accordingly, the non-metallic body 16 of the frame 12 facilitates reducing the overall weight of the heat sink 10 as compared to at least some known heat sinks. In some embodiments, the heat sink 10 has a reduced weight with a similar or approximately the same thermal performance as at least some known heat sinks. For example, in some embodiments, the non-metallic body 16 of the frame 12 reduces the weight of the heat sink 10 but does not negatively affect the thermal performance of the heat sink 10. Moreover, in other embodiments, the increased surface area provided by the reduced thickness and/or increased height of the cooling fins 20 compensates for any loss in thermal performance caused by the non-metallic body 16 of the frame 12. In still other embodiments, the heat sink 10 has a reduced weight and an improved thermal performance as compared to at least some known heat sinks. For example, the increased surface area provided by the reduced thickness and/or increased height of the cooling fins 20 may improve the thermal performance of the heat sink 10 in embodiments wherein the non-metallic body 16 does not negatively affect the thermal performance of the heat sink 10. Moreover, and for example, the increased surface area provided by the reduced thickness and/or increased height of the cooling fins 20 may more than compensate for any loss in thermal performance caused by the non-metallic body 16 of the frame 12.

Figure 5:
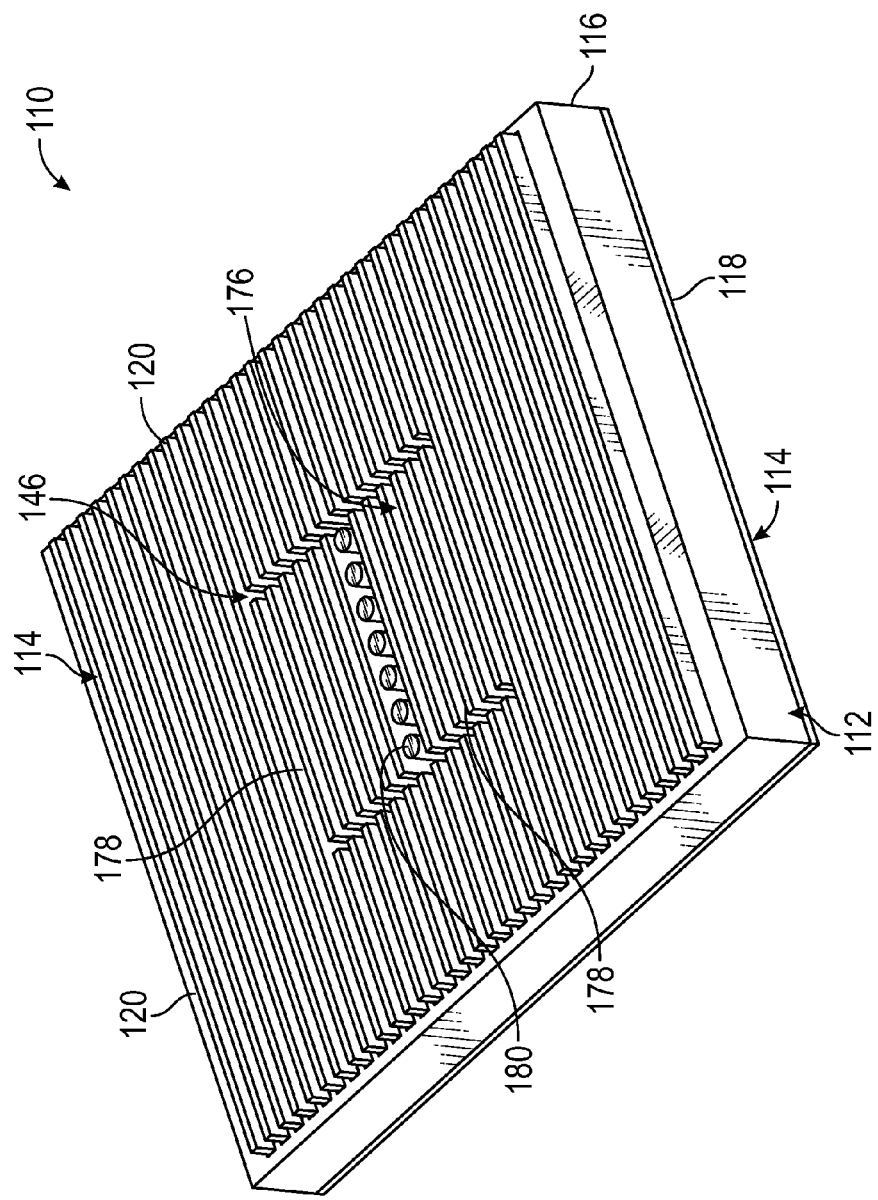
FIG. 5 is a perspective view of another exemplary embodiment of a heat sink.

FIG. 5 is a perspective view of another exemplary embodiment of a heat sink 110. The heat sink 110 includes a frame 112 and a heat exchanger 114 held by the frame 112. The frame 112 has a non-metallic body 116 that includes one or more non-metallic materials and optionally includes a polymer that is used as a filler material. The heat exchanger 114 includes a base 118 and a plurality of cooling fins 120 that extend outward from the base 118.

The heat exchanger 114 includes a pocket 146 formed within the cooling fins 120. Specifically, the pocket 146 extends into the heights of at least some of the cooling fins 120 along the lengths of the cooling fins 120. In the exemplary embodiment of the heat exchanger 114, the pocket 146 extends at an approximate middle of the length and width of the heat exchanger 114. In addition or alternatively, the pocket 146 extends at another location along the width and/or the length of the heat exchanger 114. Although shown as having the general shape of a rectangle, the pocket 146 may additionally or alternatively include any other shape, such as, but not limited to, another rectangular shape (e.g., a square shape), a circular shape, an oval shape, shape having more than four sides, an irregular shape, and/or the like. The pocket 146 may have any size relative to the size of the heat exchanger 114 overall. The pocket 146 may extend any depth into the heat exchanger 114.

The heat exchanger 114 includes aluminum. Specifically, the heat exchanger 114 is fabricated from aluminum and/or an aluminum alloy. In the exemplary embodiment of the heat exchanger 114, an approximate entirety of the heat exchanger 114 is fabricated from aluminum and/or an aluminum alloy. Alternatively, only a majority of the heat exchanger 114 is fabricated from aluminum and/or an aluminum alloy (e.g., the heat exchanger 114 includes plating that does not include aluminum).

The heat sink 110 includes a copper insert 176 that is received within the pocket 146. The copper insert 176 includes a plurality of cooling fins 178. Although twelve are shown, the copper insert 176 may include any number of the cooling fins 178.

The copper insert 176 includes copper. Specifically, the copper insert 176 is fabricated from copper and/or a copper alloy. In the exemplary embodiment of the copper insert 176, an approximate entirety of the copper insert 176 is fabricated from copper and/or a copper alloy. Alternatively, only a majority of the copper insert 176 is fabricated from copper and/or a copper alloy (e.g., the copper insert 176 includes plating that does not include copper). Although shown as having the general shape of a rectangle, the copper insert 176 may additionally or alternatively include any other shape, such as, but not limited to, another rectangular shape (e.g., a square shape), a circular shape, an oval shape, shape having more than four sides, an irregular shape, and/or the like. The shape of the copper insert 176 may or may not be the same as the shape of the pocket 146. The copper insert 176 may have any size relative to the size of the heat exchanger 114 overall and relative to the size of the pocket 146.

As shown in FIG. 5, the copper insert 176 is held within the pocket 146. The copper insert 176 may be held within the pocket 146 using any type of connection, such as, but not limited to, an interference fit, a snap fit, using one or more threaded and/or other type fastener, bonding and/or sealing the copper insert 176 to the heat exchanger 114 (i.e., using an adhesive, an epoxy, and/or the like to mechanically and/or chemically bond the copper insert 176 to the heat exchanger 114), and/or the like. In some embodiments, the copper insert 176 simply rests on the heat exchanger 114 without being otherwise connected to the heat exchanger 114. In the exemplary embodiment of the heat sink 110, the copper insert 176 is held within the pocket 146 using one or more threaded fasteners (not shown) that extend through one or more openings 180 of the copper insert 176.

Various parameters may be selected to provide the heat sink 110 with a predetermined weight, provide the heat sink 110 with a predetermined thermal performance, and/or to balance the weight relative to the thermal performance of the heat sink 110. Examples of such various parameters include, but are not limited to, the non-metallic material(s) (and the material(s) of a polymer used as a filler material, if included) of the non-metallic body 116, the geometry and/or structure of the non-metallic body 116, the aluminum material(s) of the heat exchanger 114, the geometry and/or structure of the heat exchanger 114 (e.g., of the cooling fins 120, the base 118, and/or the like), the copper material(s) of the copper insert 176, the geometry and/or structure of the copper insert 176 (e.g., of the cooling fins 178 and/or the like), and/or the like. The use of the copper insert 176 may increase the weight of the height sink 110 as compared to embodiments wherein the heat exchanger 114 does not include the pocket 146 and the heat sink 110 does not include the copper insert 176, for example because copper weighs more than aluminum. But, copper has better thermal conductivity than aluminum such that the copper insert 176 increases the thermal performance of the heat sink 110 as compared to embodiments wherein the heat exchanger 114 does not include the pocket 146 and the heat sink 110 does not include the copper insert 176.

The heat sink 110 may have a reduced weight as compared to at least some known heat sinks. For example, the reduction in weight of the heat sink 110 provided by the non-metallic body 116 may be greater than the additional weight of the copper insert 176. Moreover, the heat sink 110 may have an increased thermal performance as compared to at least some known heat sinks. For example, the increased thermal conductivity of the copper insert 176 as compared to the aluminum heat exchanger 114 may provide the heat sink 110 with an increased thermal performance as compared to at least some known heat sinks 110. In some embodiments, the heat sink 110 has a reduced weight with a similar or approximately the same thermal performance as at least some known heat sinks. In still other embodiments, the heat sink 110 has a reduced weight and an improved thermal performance as compared to at least some known heat sinks.

The copper insert 176 may increase the thermal performance of the heat sink 110 by a greater relative amount than the copper insert 176 increases the weight of the heat sink 110, which may enable the heat sink 110 to be both lighter and have better thermal performance than at least some known heat sinks.

Figure 6:
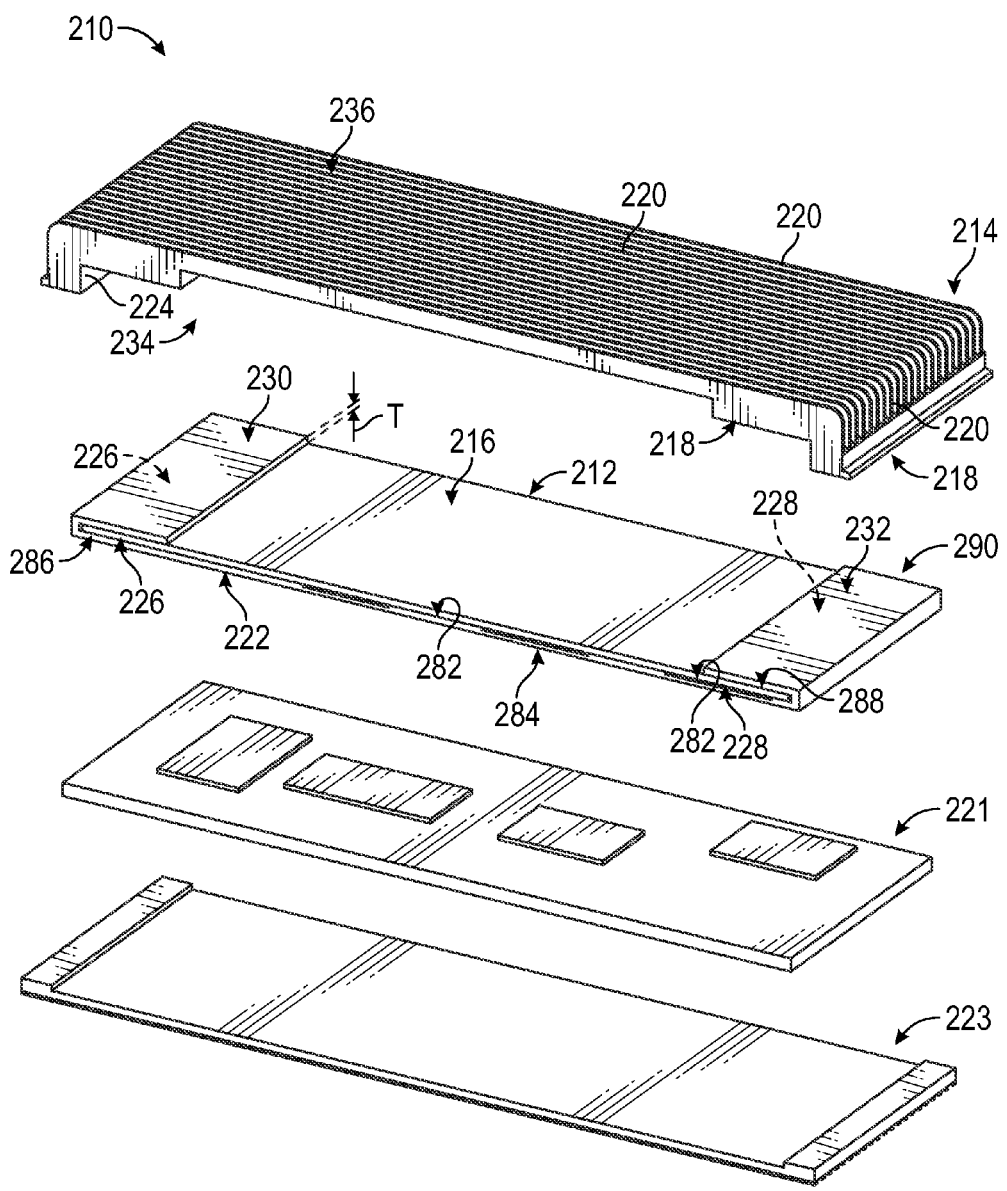
FIG. 6 is an exploded perspective view of another exemplary embodiment of a heat sink.

FIG. 6 is an exploded perspective view of another exemplary embodiment of a heat sink 210. The heat sink 210 includes a base frame 212, a heat exchanger 214, and a base plate 222. An exemplary structure 221 from which the heat sink 210 is configured to absorb and dissipate heat is shown in FIG. 6. The structure 221 shown in FIG. 6 is a circuit board, but the structure 221 is not limited to being a circuit board or an electrical component. Rather, the structure 221 may be any other structure from which it is desired to dissipate heat. Optionally, the heat sink 210 includes a bottom cover 223, which may be fabricated from any material(s) and may have any geometry and structure.

The heat exchanger 214 includes a base 218 and a plurality of cooling fins 220 that extend outward from the base 218. The base 218 includes a structure side 234 and an opposite environmental side 236. In the exemplary embodiment of the heat sink 210, the structure side 234 includes a recess 224 that receives the base frame 212 and the base plate 222 therein, as will be described below. The cooling fins 220 extend outward from the environmental side 236 of the base 218.

The heat exchanger 214 may include any materials, such as, but not limited to, aluminum, copper, another metal, and/or the like. In some embodiments, the heat exchanger 214 includes an aluminum alloy, a copper alloy, another metal alloy, and/or the like. Moreover, in some embodiments, a majority or an approximate entirety of the heat exchanger is fabricated from a single material and/or material alloy. In the exemplary embodiment of the heat exchanger 214, an approximate entirety of the heat exchanger 214 is fabricated from aluminum (and/or an aluminum alloy), copper (and/or a copper alloy), and/or another metal (and/or another metal alloy). One example of fabricating less than an approximate entirety of the heat exchanger 214 from a single material and/or material alloy includes providing the heat exchanger 214 with a base material and/or material alloy that is coated (e.g., plated) with one or more different materials and/or material alloys.

The base frame 212 of the heat sink 210 includes a non-metallic body 216. The non-metallic body 216 of the base frame 212 extends from an end segment 226 to an opposite end segment 228. In the exemplary embodiment of the base frame 212, the non-metallic body 216 has the general shape of a rectangle. But, the non-metallic body 216 of the base frame 212 may additionally or alternatively include any other shape, such as, but not limited to, another rectangular shape (e.g., a square shape), a circular shape, an oval shape, shape having more than four sides, an irregular shape, and/or the like. The shape of the non-metallic body 216 may or may not be the same as the shape of the recess 224. The thickness of the non-metallic body 216 may have any value and may be defined by any number of layers. The end segments 226 and 228 may be referred to herein as "ends".

The non-metallic body 216 of the base frame 212 includes one or more non-metallic materials. The non-metallic body 216 may include any non-metallic material and may include any number of different non-metallic materials. In some embodiments, a majority or an approximate entirety of the non-metallic body 216 is fabricated from one or more non-metallic materials. In some embodiments, the non-metallic body 216 does not include a metal. One example of fabricating less than an approximate entirety of the non-metallic body 216 from one or more non-metallic materials includes providing the non-metallic body 216 with one or more non-metallic base materials that is coated with one or more metallic materials. The non-metallic body 216 may or may not include a hollow interior space that is filled with a polymer, air, another gas, a vacuum, and/or the like.

The non-metallic material(s) of the non-metallic body 216 may each be any type of non-metallic material, such as, but not limited to, a composite material, a plastic, and/or the like. Examples of composite materials that the non-metallic body 216 may be fabricated from include, but are not limited to, a fiber-reinforced composite material, a fiber-reinforced polymer (FRP), a thermoplastic composite, a short fiber thermoplastic, a long fiber thermoplastic, a continuous fiber thermoplastic, a thermoset composite, a shape memory polymer composite, a metal matrix composite (MMC), a ceramic matrix composite, cermet, an organic matrix/ceramic aggregate composite, a wood plastic composite, an engineered wood, and/or the like. Any composite materials of the non-metallic body 16 may include a reinforcement material and a matrix material. Examples of reinforcement materials that may be used to fabricate the non-metallic body 216 include, but are not limited to, carbon fibers, a short fiber reinforcement material, a long fiber reinforcement material, a continuous fiber reinforcement material, glass fibers, metal fibers, a metal powder, aramid fibers, para-aramid fibers, meta-aramid fibers, a ceramic, and/or the like. The reinforcement materials may be arranged in any orientation and/or pattern, such as, but not limited to, a random pattern, a woven pattern, and/or the like. Examples of matrix materials that may be used to fabricate the non-metallic body 216 include, but are not limited to, polyester, vinyl ester, epoxy, phenolic, polyimide, polyamide, polypropylene, polyether ether ketone (PEEK), a shape memory polymer, a ceramic, and/or the like.

Examples of plastics that the non-metallic body 216 may be fabricated from include, but are not limited to, a thermoplastic, a thermosetting polymer, an acrylic, a polyester, a silicone, a polyurethane (PU), a halogenated plastic, a condensation plastic, a polyaddition plastic, a cross-linked plastic, a polyethylene (PE), low-density PE (LDPE), high-density PE, a polypropylene (PP), a polyamide (i.e., nylon), a polystyrene (PS), high impact PS, polyvinyl chloride (PVC), polytetrafluoroethylene (PTFE), polyvinylidene chloride (PVDC), polyethylene terephthalate (PET), acrylonitrile butadiene styrene (ABS), PE/ABS, polycarbonate (PC), PC/ABS, polymethyl methacrylate (PMMA), urea-formaldehyde (UF), melamine formaldehyde (MF), a plastarch material, a phenolic (PF; also referred to as phenol formaldehydes), polyetheretherketone (PEEK), polyetherimide (PEI), polylactic acid (PLA), an elastomeric plastic, a synthetic plastic, a natural plastic, a bioplastic, a biodegradable plastic, a semi-crystalline plastic, a semi-amorphous plastic, a completely amorphous plastic, a natural rubber, a synthetic rubber, and/or the like.

Various parameters may be selected to reduce the weight of the heat sink 210 as compared to at least some known heat sinks Examples of such various parameters include, but are not limited to, the particular non-metallic material(s) of the non-metallic body 216, the amount of the non-metallic body 216 that is fabricated from the non-metallic material(s), and/or the like.

The base plate 222 extends from an end segment 230 to an opposite end segment 232. In the exemplary embodiment of the base plate 222, the base plate 222 has the general shape of a rectangle. But, the base plate 222 may additionally or alternatively include any other shape, such as, but not limited to, another rectangular shape (e.g., a square shape), a circular shape, an oval shape, shape having more than four sides, an irregular shape, and/or the like. The shape of the base plate 222 may or may not be the same as the shape of the base frame 212 and/or the recess 224.

The base plate 222 has a frame side 282 and an opposite structure side 284. The structure side 284 is configured to be connected in thermal communication with the structure 221 for absorbing heat from the structure 221. The structure side 284 of the base plate 222 may be connected in thermal communication with the structure 221 in any manner that enables the base plate 222 to absorb heat from the structure. For example, the structure side 284 of the base plate 222 may be engaged with the structure 221 to directly connect the base plate 222 and the structure 221 in thermal communication, and/or a thermal interface material (not shown) may be engaged between the structure side 284 of the base plate 222 and the structure 221 to indirectly connect the base plate 222 and the structure 221 in thermal communication.

As can be seen in FIG. 6, the end segments 230 and 232 of the base plate 222 are folded over such that the end segments 230 and 232 overlap the frame side 282. Pockets 286 and 288 are defined between the frame side 282 and the end segments 230 and 232, respectively, where the end segments 230 and 232 overlap the frame side 282.

The base plate 222 includes carbon graphite. In the exemplary embodiment of the base plate 222, an approximate entirety of the base plate 222 is fabricated from carbon graphite. Alternatively, only a majority of the base plate 222 is fabricated from carbon graphite. The base plate 222 has at thickness T that may have any value and may be defined by any number of layers. In some embodiments, the base plate 222 includes at least two layers that are fabricated at least partially from carbon graphite.

The base frame 212 and the base plate 222 are assembled together to define an assembly 290. Specifically, the base frame 212 is held by the base plate 222 such that the base frame 212 is engaged in physical contact with the frame side 282 of the base plate 222. The end segments 226 and 228 of the base frame 212 are received within the respective pockets 286 and 288 of the base plate 222. Specifically, the end segments 230 and 232 of the base plate 222 are wrapped over the respective end segments 226 and 228 of the base frame 212 such that the end segments 226 and 228 of the base frame 212 are sandwiched between the respective end segments 230 and 232 and the frame side 282 of the base plate 222.

Figure 7:
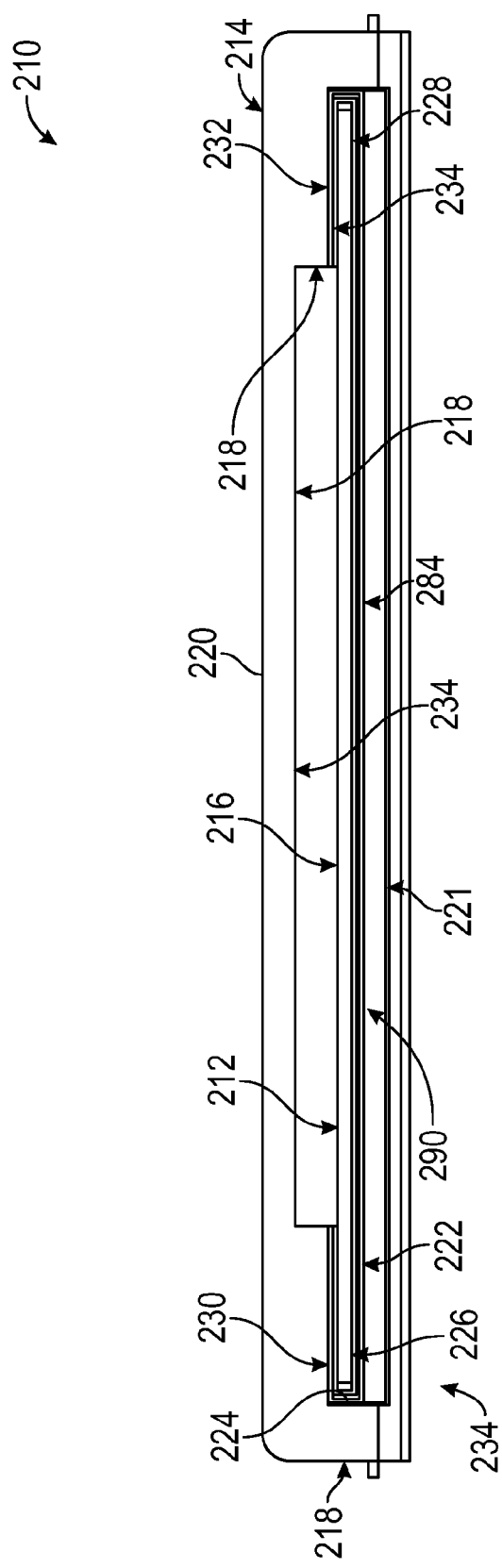
FIG. 7 is an elevational view of the heat sink shown in FIG. 6 illustrating the heat sink as assembled.

FIG. 7 is an elevational view of the heat sink 210 illustrating the heat sink 210 as assembled. The assembly 290 of the base frame 212 and the base plate 222 is held within the recess 224 of the heat exchanger 214. At least a portion of the base frame 212 is sandwiched between the base plate 222 and the structure side 234 of the heat exchanger 214, as can be seen in FIG. 7. The base plate 222 is connected in thermal communication with the structure side 234 of the base 218 of the heat exchanger 214. Specifically, the end segments 230 and 232 of the base plate 222 are sandwiched between the structure side 234 of the base 218 and the respective end segments 226 and 228 of the base frame 212. In the exemplary embodiment of the heat sink 210, the base plate 222 is engaged in physical contact with the structure side 234 of the base 218 of the heat exchanger 214 at the end segments 230 and 232, as can be seen in FIG. 7. In other words, the end segments 230 and 232 of the base plate 222 are engaged in physical contact with the structure side 234 of base 218 to directly connect the base plate 222 and the heat exchanger 214 in thermal communication. In addition or alternatively, a thermal interface material (not shown) is positioned between the structure side 234 of the base 218 and the end segments 230 and 232 of the base plate 222 to indirectly connect the base plate 222 and the heat exchanger 214 in thermal communication.

The base plate 222 is connected in thermal communication with the structure 221. Specifically, in the exemplary embodiment of the heat sink 210, the structure side 284 of the base plate 222 is engaged in physical contact with the structure 221, as shown in FIG. 7. In addition or alternatively, a thermal interface material (not shown) is positioned between the structure side 284 of the base plate 222 and the structure 221 to indirectly connect the base plate 222 and the structure 221 in thermal communication. The structure side 234 of the base 218 of the heat exchanger 214 is thus configured to thermally communicate with the structure 221 through the base plate 222 for absorbing heat from the structure 221. For example, heat from the structure 221 is absorbed by the base plate 222 via the thermal communication between the structure 221 and the structure side 284 of the base plate 222. The heat is conducted along the base plate 222 to the end segments 230 and 232. The heat is then absorbed by the heat exchanger 214 via the thermal communication between the end segments 230 and 232 of the base plate 222 and the structure side 234 of the base 218 of the heat exchanger 214. Heat absorbed by the base 218 of heat exchanger 214 is dissipated to the environment via the cooling fins 220.

Various parameters may be selected to provide the heat sink 210 with a predetermined weight, provide the heat sink 210 with a predetermined thermal performance, and/or to balance the weight relative to the thermal performance of the heat sink 210. Examples of such various parameters include, but are not limited to, the non-metallic material(s) of the non-metallic body 216, the geometry and/or structure of the non-metallic body 216 (e.g., the thickness and/or another dimension of the body 216), the geometry and/or structure of the base plate 222 (e.g., the thickness T and/or another dimension of the base plate 222, the material(s) of the heat exchanger 214, the geometry and/or structure of the heat exchanger 214 (e.g., of the cooling fins 220, the base 218, and/or the like), and/or the like.

The heat sink 210 may have a reduced weight as compared to at least some known heat sinks. For example, the non-metallic material(s) of the non-metallic body 216 of the base frame 212 and the carbon graphite of the base plate 222 have less weight than the aluminum and/or copper materials used in at least some known heat sinks. Accordingly, the non-metallic body 216 of the base frame 212 and/or the carbon graphite of the base plate 222 facilitates reducing the overall weight of the heat sink 210 as compared to at least some known heat sinks. In some embodiments, the heat sink 210 has a reduced weight with a similar or approximately the same thermal performance as at least some known heat sinks. In still other embodiments, the heat sink 210 has a reduced weight and an improved thermal performance as compared to at least some known heat sinks.

Figure 8:
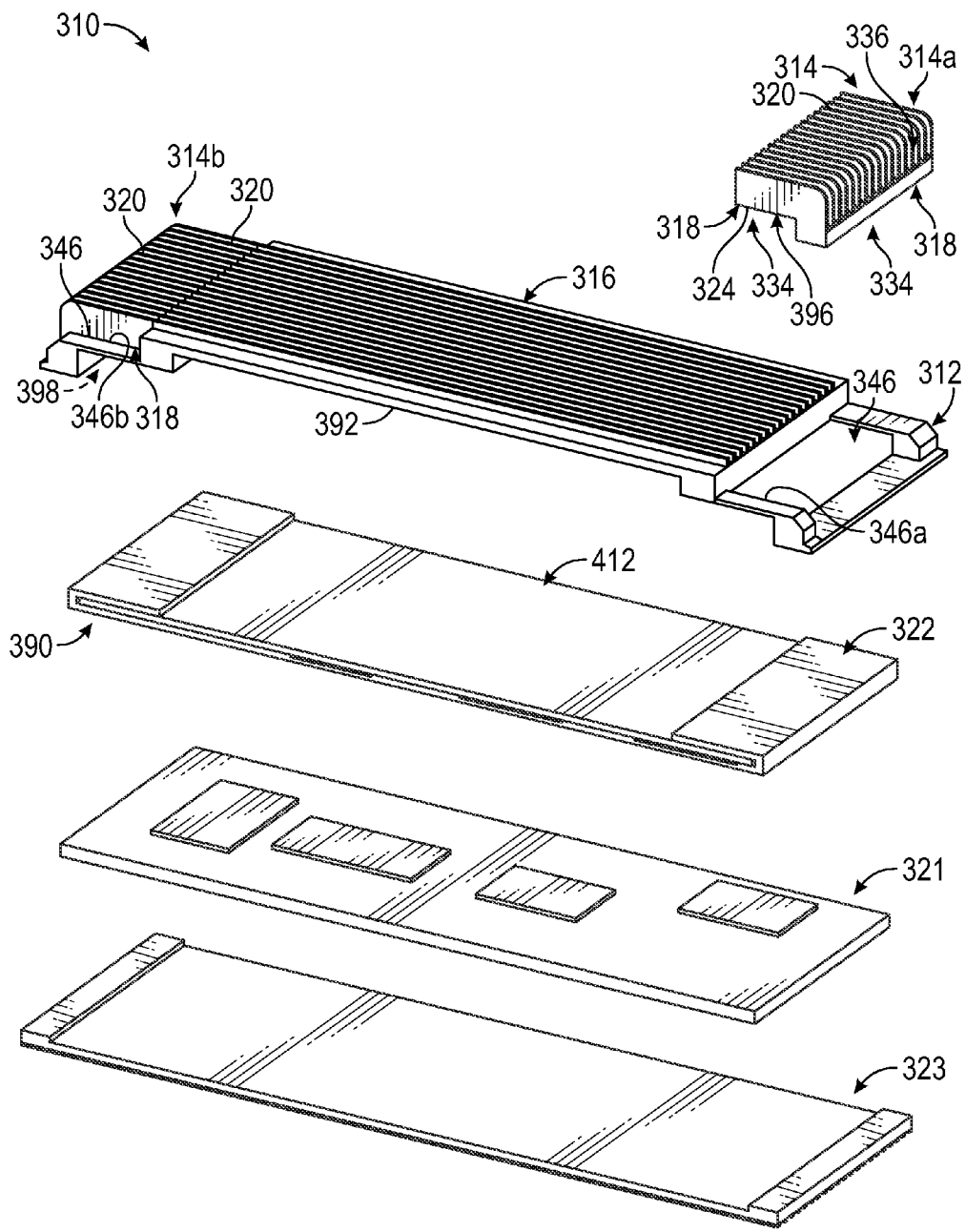
FIG. 8 is an exploded perspective view of another exemplary embodiment of a heat sink.

FIG. 8 is an exploded perspective view of another exemplary embodiment of a heat sink 310. The heat sink 310 includes a frame 312 and heat exchanger inserts 314 held by the frame 312. An exemplary structure 321 from which the heat sink 310 is configured to absorb and dissipate heat is shown in FIG. 8. The structure 321 shown in FIG. 8 is a circuit board, but the structure 321 may be any other structure from which it is desired to dissipate heat. Optionally, the heat sink 310 includes a bottom cover 323, which may be fabricated from any material(s) and may have any geometry and structure.

The frame 312 includes a non-metallic body 316 that includes insert pockets 346 and a platform 392 that extends between the insert pockets 346. As will be described below, each inset pocket 346 is configured to hold a corresponding heat exchanger insert 314 therein. In the exemplary embodiment of the frame 312, the non-metallic body 316 includes two insert pockets 346a and 346b for each holding a respective heat exchanger insert 314a and 314b. But, the non-metallic body 316 may include any number of insert pockets 346 for holding any number of heat exchanger inserts 314, whether or not any insert pockets 346 hold more than one heat exchanger insert 314. Although shown as having the general shape of a rectangle, each insert pocket 346 may additionally or alternatively include any other shape, such as, but not limited to, another rectangular shape (e.g., a square shape), a circular shape, an oval shape, shape having more than four sides, an irregular shape, and/or the like. Each insert pocket 346 may have any size relative to the size of the heat exchanger 314 overall. The non-metallic body 316 of the frame 312 may additionally or alternatively include any other shape than is shown herein.

The non-metallic body 316 of the frame 312 includes one or more non-metallic materials. The non-metallic body 316 may include any non-metallic material and may include any number of different non-metallic materials. In some embodiments, a majority or an approximate entirety of the non-metallic body 316 is fabricated from one or more non-metallic materials. In some embodiments, the non-metallic body 316 does not include a metal. One example of fabricating less than an approximate entirety of the non-metallic body 316 from one or more non-metallic materials includes providing the non-metallic body 316 with one or more non-metallic base materials that is coated with one or more metallic materials. The non-metallic body 316 may or may not include a hollow interior space that is filled with a polymer, air, another gas, vacuum, and/or the like.

The non-metallic material(s) of the non-metallic body 316 may each be any type of non-metallic material, such as, but not limited to, a composite material, a plastic, and/or the like. Examples of composite materials that the non-metallic body 316 may be fabricated from include, but are not limited to, a fiber-reinforced composite material, a fiber-reinforced polymer (FRP), a thermoplastic composite, a short fiber thermoplastic, a long fiber thermoplastic, a continuous fiber thermoplastic, a thermoset composite, a shape memory polymer composite, a metal matrix composite (MMC), a ceramic matrix composite, cermet, an organic matrix/ceramic aggregate composite, a wood plastic composite, an engineered wood, and/or the like. Any composite materials of the non-metallic body 316 may include a reinforcement material and a matrix material. Examples of reinforcement materials that may be used to fabricated the non-metallic body 316 include, but are not limited to, carbon fibers, a short fiber reinforcement material, a long fiber reinforcement material, a continuous fiber reinforcement material, glass fibers, metal fibers, a metal powder, aramid fibers, para-aramid fibers, meta-aramid fibers, a ceramic, and/or the like. The reinforcement materials may be arranged in any orientation and/or pattern, such as, but not limited to, a random pattern, a woven pattern, and/or the like. Examples of matrix materials that may be used to fabricate the non-metallic body 316 include, but are not limited to, polyester, vinyl ester, epoxy, phenolic, polyimide, polyamide, polypropylene, polyether ether ketone (PEEK), a shape memory polymer, a ceramic, and/or the like.

Examples of plastics that the non-metallic body 316 may be fabricated from include, but are not limited to, a thermoplastic, a thermosetting polymer, an acrylic, a polyester, a silicone, a polyurethane (PU), a halogenated plastic, a condensation plastic, a polyaddition plastic, a cross-linked plastic, a polyethylene (PE), low-density PE (LDPE), high-density PE, a polypropylene (PP), a polyamide (i.e., nylon), a polystyrene (PS), high impact PS, polyvinyl chloride (PVC), polytetrafluoroethylene (PTFE), polyvinylidene chloride (PVDC), polyethylene terephthalate (PET), acrylonitrile butadiene styrene (ABS), PE/ABS, polycarbonate (PC), PC/ABS, polymethyl methacrylate (PMMA), urea-formaldehyde (UF), melamine formaldehyde (MF), a plastarch material, a phenolic (PF; also referred to as phenol formaldehydes), polyetheretherketone (PEEK), polyetherimide (PEI), polylactic acid (PLA), an elastomeric plastic, a synthetic plastic, a natural plastic, a bioplastic, a biodegradable plastic, a semi-crystalline plastic, a semi-amorphous plastic, a completely amorphous plastic, a natural rubber, a synthetic rubber, and/or the like.

Various parameters may be selected to reduce the weight of the heat sink 310 as compared to at least some known heat sinks Examples of such various parameters include, but are not limited to, the particular non-metallic material(s) of the non-metallic body 316, the particular polymer(s), the amount of the non-metallic body 316 that is fabricated from the non-metallic material(s), the amount of the non-metallic body 316 that is fabricated from the polymer(s), and/or the like.

Each heat exchanger insert 314 includes a base 318 and a plurality of cooling fins 320 that extend outward from the base 318. The base 318 includes a structure side 334 and an opposite environmental side 336. The cooling fins 320 extend outward from the environmental side 336 of the base 318. Each heat exchanger insert 314 optionally includes a recess 324. Although shown as having the general shape of a rectangle, each heat exchanger insert 314 may additionally or alternatively include any other shape, such as, but not limited to, another rectangular shape (e.g., a square shape), a circular shape, an oval shape, shape having more than four sides, an irregular shape, and/or the like. The shape of each heat exchanger insert 314 may or may not be the same as the shape of the corresponding insert pocket 346. Each heat exchanger insert 314 may have any size relative to the size of the heat exchanger 314 overall and relative to the size of the corresponding pocket 346.

Each heat exchanger insert 314 may include any materials, such as, but not limited to, aluminum, copper, another metal, and/or the like. In some embodiments, one or more of the heat exchanger inserts 314 includes an aluminum alloy, a copper alloy, another metal alloy, and/or the like. Moreover, in some embodiments, a majority or an approximate entirety of one or more of the heat exchanger inserts 314 is fabricated from a single material and/or material alloy. In the exemplary embodiment of the heat exchanger inserts 314, an approximate entirety of each heat exchanger insert 314 is fabricated from aluminum (and/or an aluminum alloy), copper (and/or a copper alloy), and/or another metal (and/or another metal alloy). One example of fabricating less than an approximate entirety of a heat exchanger insert 314 from a single material and/or material alloy includes providing the heat exchanger insert 314 with a base material and/or material alloy that is coated (e.g., plated) with one or more different materials and/or material alloys.

Optionally, the heat sink 310 includes an assembly 390 of a base frame 412 and a base plate 322. The base frame 412 is substantially similar to the base frame 212 (FIGS. 6 and 7) and therefore will not be described in more detail herein. The base plate 322 is substantially similar to the base plate 222 (FIGS. 6 and 7) and therefore will not be described in more detail herein.

Figure 9:
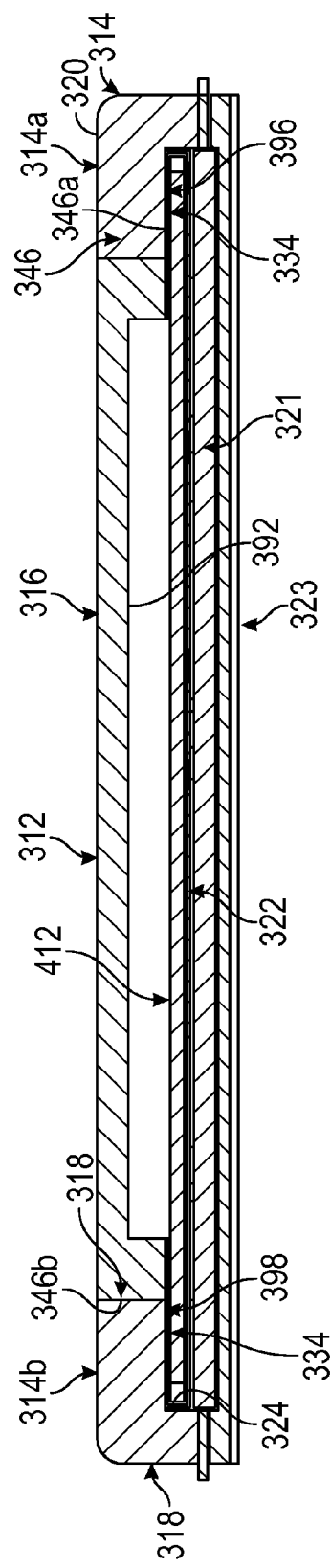
FIG. 9 is a cross-sectional view of the heat sink shown in FIG. 8 illustrating the heat sink as assembled.

FIG. 9 is a cross-sectional view of the heat sink 310 illustrating the heat sink 310 as assembled. Each heat exchanger insert 314a and 314b is held within the respective insert pocket 346a and 346b. A segment 396 and 398 (best seen in FIG. 8) of the structure side 334 of the heat exchanger inserts 314a and 314b, respectively, is exposed within the respective insert pocket 346a and 346b. The exposure of the segments 396 and 398 enables the structure side 334 of each heat exchanger insert 314a and 314b to thermally communicate with the structure 321 for absorbing heat from the structure, as will be described below. In some embodiments, the cooling fins 320 of one or more of the heat exchanger inserts 314 may extend over the platform 392 of the frame 312 such that the cooling fins 320 overlap the platform 392. Each cooling fin 320 of each heat exchanger insert 314 may overlap the platform 392 by any amount. In some embodiments, the cooling fins 320 of two or more heat exchanger inserts 314 overlap a majority or an approximate entirety of the dimension of the platform 392 from the insert pocket 346a to the insert pocket 346b.

Each heat exchanger insert 314 may be held within the corresponding insert pocket 346 using any type of connection, such as, but not limited to, an interference fit, a snap fit, using one or more threaded and/or other type fastener, bonding and/or sealing the heat exchanger insert 314 to the frame 312 (i.e., using an adhesive, an epoxy, and/or the like to mechanically and/or chemically bond the heat exchanger insert 314 to the frame 312), and/or the like. In some embodiments, one or more heat exchanger inserts 314 simply rests on the frame 312 without being otherwise connected to the frame 312. In the exemplary embodiment of the heat sink 310, the heat exchanger inserts 314 are held within the insert pockets 346 using a snap-fit connection provided by one or more snap-fit features (not shown) of the frame 312.

The assembly 390 of the base frame 412 and the base plate 322 is held within the recesses 324 of the heat exchanger inserts 314. The base plate 322 is connected in thermal communication with the segments 396 and 398 of the structure sides 334 of the heat exchanger inserts 314a and 314b, respectively. The base plate 322 is connected in thermal communication with the structure 321. The structure sides 334 of the heat exchanger inserts 314 are thus configured to thermally communicate with the structure 321 through the base plate 322 for absorbing heat from the structure.

Various parameters may be selected to provide the heat sink 310 with a predetermined weight, provide the heat sink 310 with a predetermined thermal performance, and/or to balance the weight relative to the thermal performance of the heat sink 310. Examples of such various parameters include, but are not limited to, the non-metallic material(s) of the non-metallic body 316, the geometry and/or structure of the non-metallic body 316, the non-metallic material(s) of the non-metallic body of the base frame 412, the geometry and/or structure of the non-metallic body of the base frame 412 (e.g., the thickness and/or another dimension of the body), the geometry and/or structure of the base plate 322 (e.g., the thickness T and/or another dimension of the base plate 322, the material(s) of the heat exchanger inserts 314, the geometry and/or structure of the heat exchanger inserts 314 (e.g., of the cooling fins 320, the base 318, and/or the like), and/or the like.

The heat sink 310 may have a reduced weight as compared to at least some known heat sinks. For example, the non-metallic material(s) of the non-metallic body 316 of the frame 312, the non-metallic material(s) of the non-metallic body of the base frame 412, and the carbon graphite of the base plate 322 have less weight than the aluminum and/or copper materials used in at least some known heat sinks. Accordingly, the non-metallic body 316 of the frame 312, the non-metallic body of the base frame 412, and/or the carbon graphite of the base plate 322 facilitates reducing the overall weight of the heat sink 310 as compared to at least some known heat sinks. In some embodiments, the heat sink 310 has a reduced weight with a similar or approximately the same thermal performance as at least some known heat sinks. In still other embodiments, the heat sink 310 has a reduced weight and an improved thermal performance as compared to at least some known heat sinks.

One or more heat pipes may be used with the heat sink embodiments described and/or illustrated herein to improve the thermal performance of the heat sinks. The heat pipe(s) may be used in any configuration. For example, the heat pipe(s) may be connected in thermal communication with any component(s) of the heat sink. Any number and any type(s) of heat pipes may be used, such as, but not limited to, vapor chamber heat pipes, flat heat pipes, loop heat pipes, and/or the like.

Figure 10:
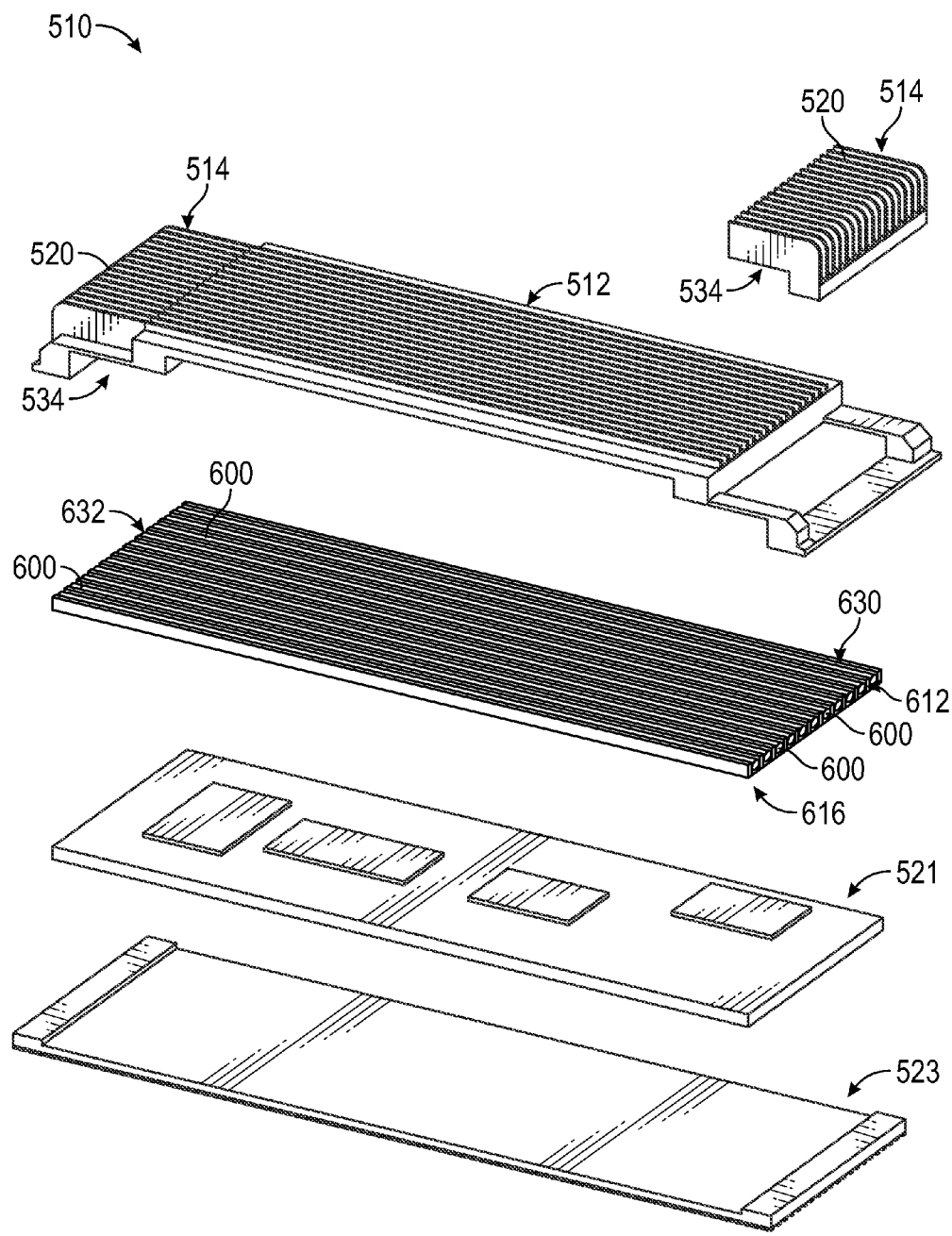
FIG. 10 is an exploded perspective view of another exemplary embodiment of a heat sink.

For example, FIG. 10 is an exploded perspective view of another exemplary embodiment of a heat sink 510 illustrating an exemplary configuration of heat pipes 600. The heat sink 510 includes a frame 512 and heat exchanger inserts 514 held by the frame 512. The frame 512 is substantially similar to the frame 312 (FIGS. 8 and 9) and therefore will not be described in more detail herein. The heat exchanger inserts 514 are substantially similar to the heat exchanger inserts 314 (FIGS. 8 and 9) and therefore will not be described in more detail herein. An exemplary structure 521 from which the heat sink 510 is configured to absorb and dissipate heat is shown in FIG. 10. The structure 521 shown in FIG. 10 is a circuit board, but the structure 521 may be any other structure from which it is desired to dissipate heat. Optionally, the heat sink 510 includes a bottom cover 523, which may be fabricated from any material(s) and may have any geometry and structure.

The heat sink 510 includes the heat pipes 600. Although eleven are shown, the heat sink 510 may include any number of the heat pipes 600. Each heat pipe 600 may be type of heat pipe, such as, but not limited to, a vapor chamber heat pipe, a flat heat pipe, a loop heat pipe, and/or the like. Optionally, the heat pipes 600 are held by a heat pipe frame 612 that includes a non-metallic body 616. The non-metallic body 616 includes one or more non-metallic materials. The non-metallic body 616 may include any non-metallic material and may include any number of different non-metallic materials. In some embodiments, a majority or an approximate entirety of the non-metallic body 616 is fabricated from one or more non-metallic materials. In some embodiments, the non-metallic body 616 does not include a metal. One example of fabricating less than an approximate entirety of the non-metallic body 616 from one or more non-metallic materials includes providing the non-metallic body 616 with one or more non-metallic base materials that is coated with one or more metallic materials. The non-metallic body 616 may or may not include a hollow interior space that is filled with a polymer, air, another gas, vacuum, and/or the like.

The non-metallic material(s) of the non-metallic body 616 may each be any type of non-metallic material, such as, but not limited to, a composite material, a plastic, and/or the like. Examples of composite materials that the non-metallic body 616 may be fabricated from include, but are not limited to, a fiber-reinforced composite material, a fiber-reinforced polymer (FRP), a thermoplastic composite, a short fiber thermoplastic, a long fiber thermoplastic, a continuous fiber thermoplastic, a thermoset composite, a shape memory polymer composite, a metal matrix composite (MMC), a ceramic matrix composite, cermet, an organic matrix/ceramic aggregate composite, a wood plastic composite, an engineered wood, and/or the like. Any composite materials of the non-metallic body 616 may include a reinforcement material and a matrix material. Examples of reinforcement materials that may be used to fabricated the non-metallic body 616 include, but are not limited to, carbon fibers, a short fiber reinforcement material, a long fiber reinforcement material, a continuous fiber reinforcement material, glass fibers, metal fibers, a metal powder, aramid fibers, para-aramid fibers, meta-aramid fibers, a ceramic, and/or the like. The reinforcement materials may be arranged in any orientation and/or pattern, such as, but not limited to, a random pattern, a woven pattern, and/or the like. Examples of matrix materials that may be used to fabricate the non-metallic body 616 include, but are not limited to, polyester, vinyl ester, epoxy, phenolic, polyimide, polyamide, polypropylene, polyether ether ketone (PEEK), a shape memory polymer, a ceramic, and/or the like.

Examples of plastics that the non-metallic body 616 may be fabricated from include, but are not limited to, a thermoplastic, a thermosetting polymer, an acrylic, a polyester, a silicone, a polyurethane (PU), a halogenated plastic, a condensation plastic, a polyaddition plastic, a cross-linked plastic, a polyethylene (PE), low-density PE (LDPE), high-density PE, a polypropylene (PP), a polyamide (i.e., nylon), a polystyrene (PS), high impact PS, polyvinyl chloride (PVC), polytetrafluoroethylene (PTFE), polyvinylidene chloride (PVDC), polyethylene terephthalate (PET), acrylonitrile butadiene styrene (ABS), PE/ABS, polycarbonate (PC), PC/ABS, polymethyl methacrylate (PMMA), urea-formaldehyde (UF), melamine formaldehyde (MF), a plastarch material, a phenolic (PF; also referred to as phenol formaldehydes), polyetheretherketone (PEEK), polyetherimide (PEI), polylactic acid (PLA), an elastomeric plastic, a synthetic plastic, a natural plastic, a bioplastic, a biodegradable plastic, a semi-crystalline plastic, a semi-amorphous plastic, a completely amorphous plastic, a natural rubber, a synthetic rubber, and/or the like.

Various parameters may be selected to reduce the weight of the heat sink 510 as compared to at least some known heat sinks Examples of such various parameters include, but are not limited to, the particular non-metallic material(s) of the non-metallic body 616, the particular non-metallic material(s) of the frame 512, the particular polymer(s) of the frames 512 and/or 612, the amount of the non-metallic body 616 that is fabricated from the non-metallic material(s), the amount of the non-metallic body of the frame 512 that is fabricated from the non-metallic material(s), the amount of the non-metallic body 616 that is fabricated from the polymer(s), the amount of the non-metallic body of the frame 512 that is fabricated from the polymer(s), and/or the like.

Figure 11:
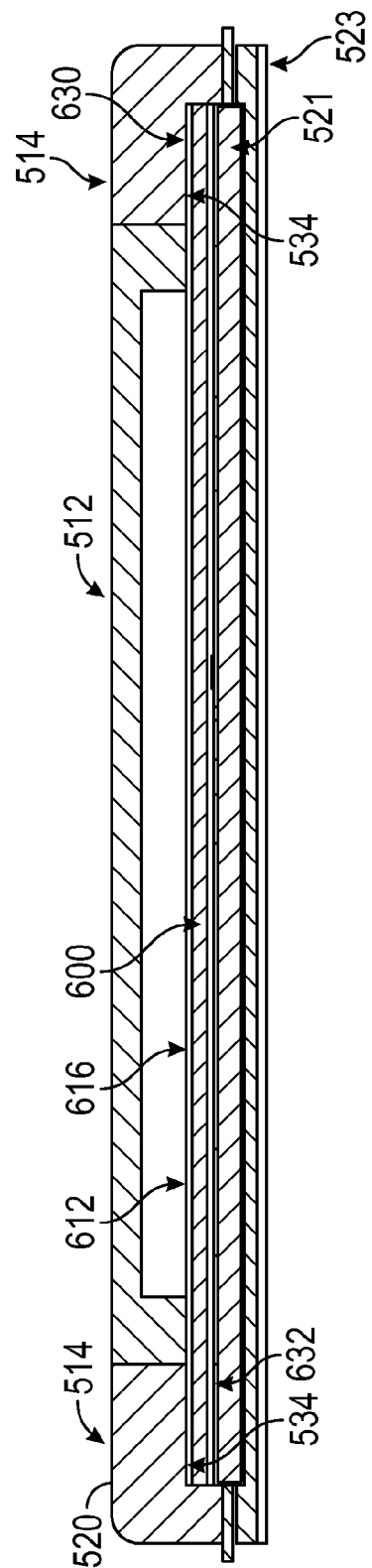
FIG. 11 is a cross-sectional view of the heat sink shown in FIG. 10 illustrating the heat sink as assembled.

FIG. 11 is a cross-sectional view of the heat sink 510 illustrating the heat sink 510 as assembled. The heat pipes 600 are sandwiched between structure sides 534 of the heat exchanger inserts 514 and the structure 521 such that the heat pipes 600 are configured to be connected in thermal communication between the heat exchanger inserts 514 and the structure 521. In the exemplary embodiment of the heat sink 510, end segments 630 and 632 of the heat pipes 600 are configured to be engaged in physical contact with the structure sides 534 of the heat exchanger inserts 514 to connect the heat pipes 600 in thermal communication with the heat exchanger inserts 514. In addition or alternatively, a thermal interface material (not shown) is positioned between the structure sides 534 of the heat exchanger inserts 514 and the end segments 630 and 632 of the heat pipes 600 to indirectly connect the heat pipes 600 and the heat exchanger inserts 514 in thermal communication. In the exemplary embodiment of the heat sink 510, the heat pipes 600 are engaged in physical contact with the structure 521 to connect the heat pipes 600 and the structure 521 in thermal communication. In addition or alternatively, a thermal interface material (not shown) is positioned between the heat pipes 600 and the structure 521 to indirectly connect the heat pipes 600 and the structure 521 in thermal communication.

The structure sides 534 of the heat exchanger inserts 514 are thus configured to thermally communicate with the structure 521 through the heat pipes 600 for absorbing heat from the structure 521. For example, heat from the structure 521 is absorbed by the heat pipes 600 via the thermal communication between the structure 521 and the heat pipes 600. The heat is conducted along the heat pipes 600 to the end segments 630 and 632 of the heat pipes 600. The heat is then absorbed by the heat exchanger inserts 514 via the thermal communication between the end segments 630 and 632 of the heat pipes and the structure sides 534 of the heat exchanger inserts 514. Heat absorbed by the heat exchanger inserts 514 is dissipated to the environment via cooling fins 520 of the heat exchanger inserts 514. Each heat pipe 600 may have any other location within the heat sink 510 that is described and/or illustrated herein and may be engaged in physical contact with any other components of the heat sink 510.

Various parameters may be selected to provide the heat sink 510 with a predetermined weight, provide the heat sink 510 with a predetermined thermal performance, and/or to balance the weight relative to the thermal performance of the heat sink 510. Examples of such various parameters include, but are not limited to, the non-metallic material(s) of the non-metallic body 616, the non-metallic material(s) of the non-metallic body of the frame 512, the geometry and/or structure of the non-metallic body 616 (e.g., the thickness and/or another dimension of the body 616), the geometry and/or structure of the non-metallic body of the frame 512 (e.g., the thickness and/or another dimension of the body), the material(s) of the heat exchanger inserts 514, the geometry and/or structure of the heat exchanger inserts 514 (e.g., of the cooling fins 520, of a base, and/or the like), and/or the like.

The heat sink 510 may have a reduced weight as compared to at least some known heat sinks. For example, the non-metallic material(s) of the non-metallic body 616 of the heat pipe frame 612 and the non-metallic material(s) of the non-metallic body of the heat pipe frame 512 have less weight than the aluminum and/or copper materials used in at least some known heat sinks. Accordingly, the non-metallic body 616 of the heat pipe frame 612 and/or the non-metallic body of the frame 512 facilitates reducing the overall weight of the heat sink 510 as compared to at least some known heat sinks. In some embodiments, the heat sink 510 has a reduced weight with a similar or approximately the same thermal performance as at least some known heat sinks. In still other embodiments, the heat sink 510 has a reduced weight and an improved thermal performance as compared to at least some known heat sinks.

The embodiments described and/or illustrated herein may provide a heat sink that has a reduced weight and/or an improved thermal performance as compared to at least some known heat sinks.

The embodiments described and/or illustrated herein may provide a heat sink that is less costly to manufacture. For example, it may be easier and therefore less costly to fabricate the frames, base frames, heat pipe frame, and/or base plates described and/or illustrated herein using non-metallic and/or carbon graphite materials as compared to using the aluminum and/or copper materials used in at least some known heat sinks.

It is to be understood that the above description and the figures are intended to be illustrative, and not restrictive. For example, the above-described and/or illustrated embodiments (and/or aspects thereof) may be used in combination with each other. Moreover, unless explicitly stated to the contrary, embodiments "comprising" or "having" an element or a plurality of elements having a particular property may include additional such elements not having that property. Further, references to "the exemplary embodiment", "one exemplary embodiment", "one embodiment", "embodiments", "some embodiments", and/or the like are not intended to be interpreted as excluding the existence of additional embodiments that also incorporate the recited feature(s).

In addition, many modifications may be made to adapt a particular situation or material to the teachings of the subject matter described and/or illustrated herein without departing from its scope. Dimensions, types of materials, orientations of the various components (including the terms "upper", "lower", "vertical", and "lateral"), and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description and the figures. The scope of the subject matter described and/or illustrated herein should, therefore, be determined with reference to the appended claims, along with the full scope of equivalents to which such claims are entitled. In the appended claims, the terms "including" and "having" are used as the plain-English equivalents of the term "comprising". Moreover, in the following claims, the terms "first," "second," and "third," etc. are used merely as labels, and are not intended to impose numerical requirements on their objects. As used herein, an element or step recited in the singular and proceeded with the word "a" or "an" should be understood as not excluding plural of said elements or steps, unless such exclusion is explicitly stated. For example, "the non-metallic material" of claims 1-12 may include one or more different non-metallic materials. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A heat sink comprising:
   a frame having a non-metallic body that includes a window, the non-metallic body including at least one peripheral wall that defines a boundary of the window, the non-metallic body comprising a non-metallic material, the non-metallic body of the frame comprising peripheral support fingers that extend from an interior surface of the at least one peripheral wall into the window; and
   a heat exchanger comprising a base and cooling fins, the base having a structure side and an opposite environmental side, the structure side of the base being configured to thermally communicate with a structure for absorbing heat from the structure, the cooling fins extending from the environmental side of the base, the cooling fins having heights defined from the environmental side to respective tips of the cooling fins, the cooling fins arranged side-by-side such that adjacent cooling fins are spaced apart laterally by a gap, the heat exchanger held by the frame such that the cooling fins extend through the window of the frame;
   wherein the peripheral support fingers of the frame are disposed in the gaps between the adjacent cooling fins of the heat exchanger for supporting the cooling fins, the peripheral support fingers supporting the cooling fins by engaging each cooling fin along an upper half of the cooling fin and along a lower half of the cooling fin, the upper half extending from the tip to a midpoint along the height of the cooling fin, the lower half extending from the midpoint of the cooling fin to the environmental side of the base.

2. The heat sink of claim 1, wherein the non-metallic material of the non-metallic body of the frame comprises at least one of a composite material or a plastic.

3. The heat sink of claim 1, wherein the non-metallic material of the non-metallic body of the frame comprises carbon fiber.

4. The heat sink of claim 1, wherein the non-metallic material of the non-metallic body of the frame is a first non-metallic material formed as a shell, the first non-metallic material of the shell comprising at least one of a composite material or a plastic, the shell being at least partially filled with a second non-metallic material that is different than the first non-metallic material of the shell, the second non-metallic material including one or more polymers.

5. The heat sink of claim 1, wherein the cooling fins extend lengths along the base, the lengths of adjacent cooling fins being spaced apart by the gap along the base, the heat exchanger comprising a slot that extends through the cooling fins across the lengths of the cooling fins, the non-metallic body of the frame comprising a bridge that extends across the window and is received within the slot, the bridge comprising bridge support fingers that extend from the bridge into the gaps between corresponding adjacent cooling fins for supporting portions of the cooling fins that are proximate to the slot.

6. The heat sink of claim 1, wherein the cooling fins extend lengths along the base, the lengths of adjacent cooling fins being spaced apart by the gap along the base, the heat exchanger comprising a slot that extends through the cooling fins across the lengths of the cooling fins, the non-metallic body of the frame comprising a bridge that extends across the window and is received within the slot, the bridge comprising opposite sets of bridge support fingers that extend from the bridge in opposite directions, the bridge support fingers being received into the gaps between corresponding adjacent cooling fins for supporting portions of the cooling fins proximate to the slot.

7. The heat sink of claim 1, wherein at least a majority of the heat exchanger is fabricated from aluminum.

8. The heat sink of claim 1, wherein the peripheral support fingers of the frame each extend from the respective peripheral wall to a distal end that does not engage the frame, the heat exchanger defining a slot that extends through the cooling fins across lengths of the cooling fins, the non-metallic body of the frame comprising a bridge that extends across the window and is received within the slot, the bridge comprising bridge support fingers that each extend from the bridge to a distal end that does not engage the frame, the bridge support fingers being received into the gaps between corresponding adjacent cooling fins, the distal ends of the bridge support fingers being separated from the distal ends of the peripheral support fingers in the gaps by air cavities that extend along the lengths of the cooling fins.

9. The heat sink of claim 8, wherein the air cavities defined between the bridge support fingers and the corresponding peripheral support fingers extend a majority of the lengths of the cooling fins such that most of the space between two adjacent cooling fins is filled with air.

10. The heat sink of claim 1, wherein the cooling fins extend heights outward from the environmental side of the base to respective tips of the cooling fins, the tips defining a top of the heat exchanger, the frame configured to be loaded over the top of the heat exchanger such that the tips of the cooling fins are received in the window prior to the frame engaging the base.

11. The heat sink of claim 1, wherein the cooling fins extend heights outward from the environmental side of the base to respective tips of the cooling fins, the peripheral support fingers extending heights from a top side of the frame to a bottom side of the frame, wherein the heights of the peripheral support fingers are at least a majority of the heights of the cooling fins for supporting the cooling fins.

12. A heat sink comprising:
a frame having a non-metallic body that includes a window, the non-metallic body including at least one peripheral wall that defines a boundary of the window, the non-metallic body including a bridge that extends across the window, the non-metallic body comprising a non-metallic material, the non-metallic body of the frame comprising peripheral support fingers that extend from an interior surface of the at least one peripheral wall into the window and bridge support fingers that extend from the bridge into the window, the peripheral support fingers and the bridge support fingers both being cantilevered relative to the frame to define respective distal ends that do not engage the frame; and
a heat exchanger comprising a base and cooling fins, the base having a structure side and an opposite environmental side, the structure side of the base being configured to thermally communicate with a structure for absorbing heat from the structure, the cooling fins extending from the environmental side of the base, the cooling fins having heights defined from the environmental side to respective tips of the cooling fins, the cooling fins being arranged side-by-side such that adjacent cooling fins are spaced apart laterally by a gap, the heat exchanger defining a slot that extends through the cooling fins across lengths of the cooling fins;
wherein the heat exchanger is held by the frame such that the cooling fins extend within the window of the frame, the bridge of the frame being received within the slot of the heat exchanger, the peripheral support fingers and the bridge support fingers being received into the gaps between corresponding adjacent cooling fins, the peripheral support fingers and the bridge support fingers supporting the cooling fins by engaging each cooling fin along an upper half of the cooling fin and along a lower half of the cooling fin, the upper half extending from the tip to a midpoint along the height of the cooling fin, the lower half extending from the midpoint of the cooling fin to the environmental side of the base, the distal ends of the bridge support fingers being separated from the distal ends of the peripheral support fingers in the gaps by air cavities that extend along the lengths of the cooling fins.

13. The heat sink of claim 12, wherein the heat exchanger is held by the frame in an assembled state of the heat sink, wherein, in a preassembled state of the heat sink when the heat exchanger is not held by the frame, the peripheral support fingers and the bridge support fingers each have a lateral width that is larger than the gaps between the adjacent cooling fins, the peripheral support fingers and the bridge support fingers in the assembled state of the heat sink being disposed in the gaps and compressed between the adjacent cooling fins for supporting the cooling fins and for providing an interference fit between the frame and the heat exchanger.

14. The heat sink of claim 12, wherein the air cavities defined between the bridge support fingers and the corresponding peripheral support fingers extend a majority of the lengths of the cooling fins such that most of the space between two adjacent cooling fins is filled with air.

15. A heat sink comprising:
a frame having a non-metallic body that includes a window, the non-metallic body including at least one peripheral wall that defines a boundary of the window, the non-metallic body comprising a non-metallic material, the non-metallic body of the frame comprising peripheral support fingers that extend from an interior surface of the at least one peripheral wall into the window, the peripheral support fingers extending heights from a top side of the frame to a bottom side of the frame; and
a heat exchanger comprising a base and cooling fins, the base having a structure side and an opposite environmental side, the structure side of the base being configured to thermally communicate with a structure for absorbing heat from the structure, the cooling fins extending heights outward from the environmental side of the base to respective tips of the cooling fins, the cooling fins being arranged side-by-side such that adjacent cooling fins are spaced apart laterally by a gap;
wherein the heat exchanger is held by the frame such that the cooling fins extend within the window of the frame, the peripheral support fingers of the frame being received into the gaps between corresponding adjacent cooling fins of the heat exchanger, the heights of the peripheral support fingers being at least a majority of the heights of the cooling fins for supporting the cooling fins.

16. The heat sink of claim 15, wherein the non-metallic material of the non-metallic body of the frame is a first non-metallic material formed as a shell, the first non-metallic material of the shell comprising at least one of a composite material or a plastic, the shell being at least partially filled with a second non-metallic material that is different than the first non-metallic material of the shell, the second non-metallic material including one or more polymers.

17. The heat sink of claim 15, wherein the peripheral support fingers of the frame each extend from the respective peripheral wall to a distal end that does not engage the frame, the heat exchanger defining a slot that extends through the cooling fins across lengths of the cooling fins, the non-metallic body of the frame comprising a bridge that extends across the window and is received within the slot, the bridge comprising bridge support fingers that each extend from the bridge to a distal end that does not engage the frame, the bridge support fingers being received into the gaps between corresponding adjacent cooling fins, the distal ends of the bridge support fingers being separated from the distal ends of the peripheral support fingers in the gaps by air cavities that extend along the lengths of the cooling fins.

18. The heat sink of claim 12, wherein the cooling fins extend heights outward from the environmental side of the base to respective tips of the cooling fins, the peripheral support fingers and the bridge support fingers extending heights from a top side of the frame to a bottom side of the frame, wherein the heights of the peripheral support fingers and the bridge support fingers are at least a majority of the heights of the cooling fins for supporting the cooling fins.

19. The heat sink of claim 17, wherein the air cavities defined between the bridge support fingers and the corresponding peripheral support fingers extend a majority of the lengths of the cooling fins such that most of the space between two adjacent cooling fins is filled with air.

20. The heat sink of claim 1, wherein the heat exchanger is held by the frame in an assembled state of the heat sink, wherein, in a preassembled state of the heat sink when the heat exchanger is not held by the frame, the peripheral support fingers each have a lateral width that is larger than the gaps between the adjacent cooling fins, the peripheral support fingers in the assembled state of the heat sink being disposed in the gaps and compressed between the adjacent cooling fins in an interference fit for supporting the cooling fins.

* * * * *